(12) United States Patent
Hirabayashi et al.

(10) Patent No.: US 6,320,204 B1
(45) Date of Patent: Nov. 20, 2001

(54) ELECTRO-OPTICAL DEVICE IN WHICH AN EXTENDING PORTION OF A CHANNEL REGION OF A SEMICONDUCTOR LAYER IS CONNECTED TO A CAPACITOR LINE AND AN ELECTRONIC APPARATUS INCLUDING THE ELECTRO-OPTICAL DEVICE

(75) Inventors: Yukiya Hirabayashi, Suwa; Shigenori Katayama; Masahiro Yasukawa, both of Chino, all of (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/493,238

(22) Filed: Jan. 28, 2000

Related U.S. Application Data

(63) Continuation-in-part of application No. 09/219,708, filed on Dec. 23, 1998, now Pat. No. 6,066,860, which is a continuation-in-part of application No. 09/215,172, filed on Dec. 18, 1998.

(30) Foreign Application Priority Data

Dec. 25, 1997 (JP) .................................................. 9-358622
Jan. 28, 1999 (JP) .................................................. 11-020147

(51) Int. Cl.[7] .......................... H01L 29/04; H01L 31/036; H01L 27/108; H01L 29/76; H01L 29/94

(52) U.S. Cl. ............................... 257/71; 257/59; 257/72; 257/296; 257/350

(58) Field of Search ................................. 257/59, 71, 72, 257/35, 296

(56) References Cited

U.S. PATENT DOCUMENTS

| | | |
|---|---|---|
| 5,644,147 | 7/1997 | Yamazaki et al. . |
| 5,691,787 * | 11/1997 | Shimada et al. ........................ 349/40 |
| 5,990,629 | 11/1999 | Yamada et al. . |
| 5,998,841 * | 12/1999 | Suzawa ................. 257/350 |
| 6,111,270 * | 8/2000 | Xu et al. ................. 257/72 |

* cited by examiner

*Primary Examiner*—Ngân V. Ngô
(74) *Attorney, Agent, or Firm*—Oliff & Berridge, PLC

(57) ABSTRACT

A channel region of a semiconductor layer has an extending portion. The terminal of the extending portion is connected to a first contact hole. The first contact hole is connected to a connecting line. The connecting line is connected to the first contact hole at one end, as described above, extends directly above a capacitor line in the Y direction, and is connected to the capacitor line via a second contact hole at this position.

16 Claims, 20 Drawing Sheets

[Fig. 1]
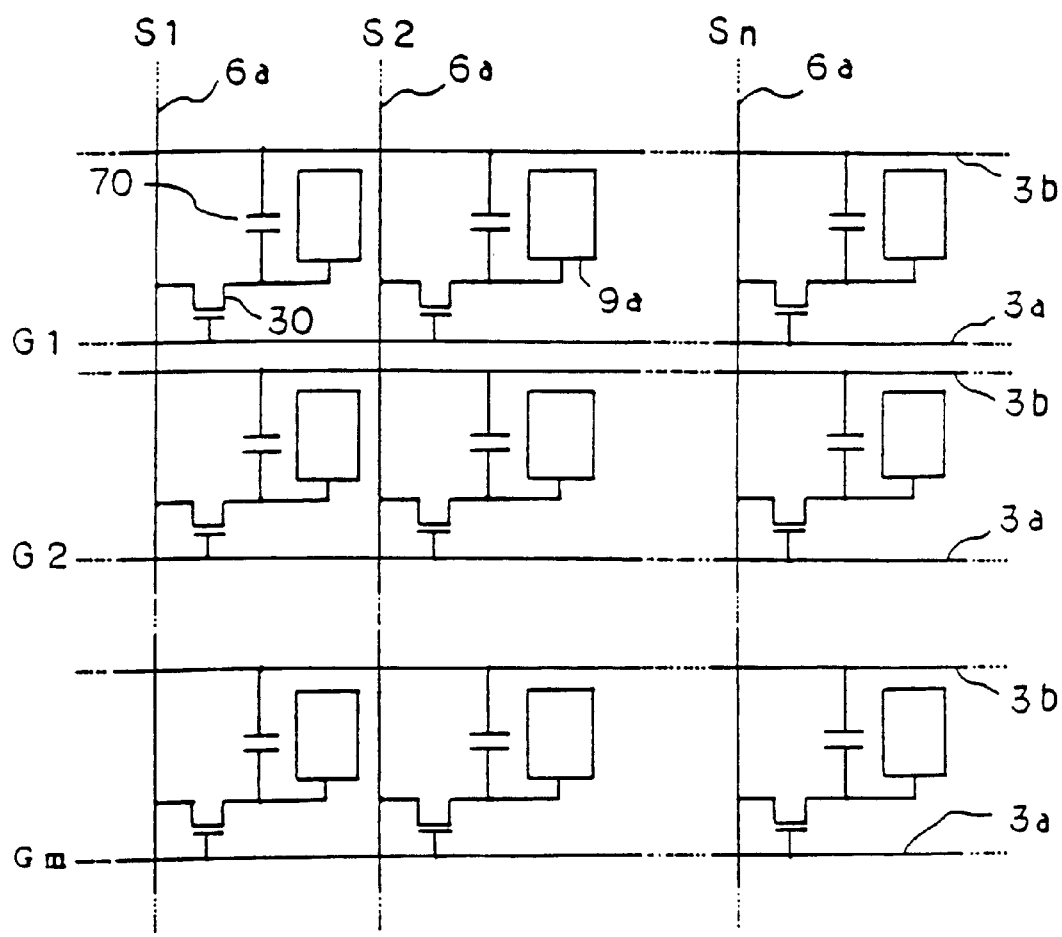

[Fig. 2]
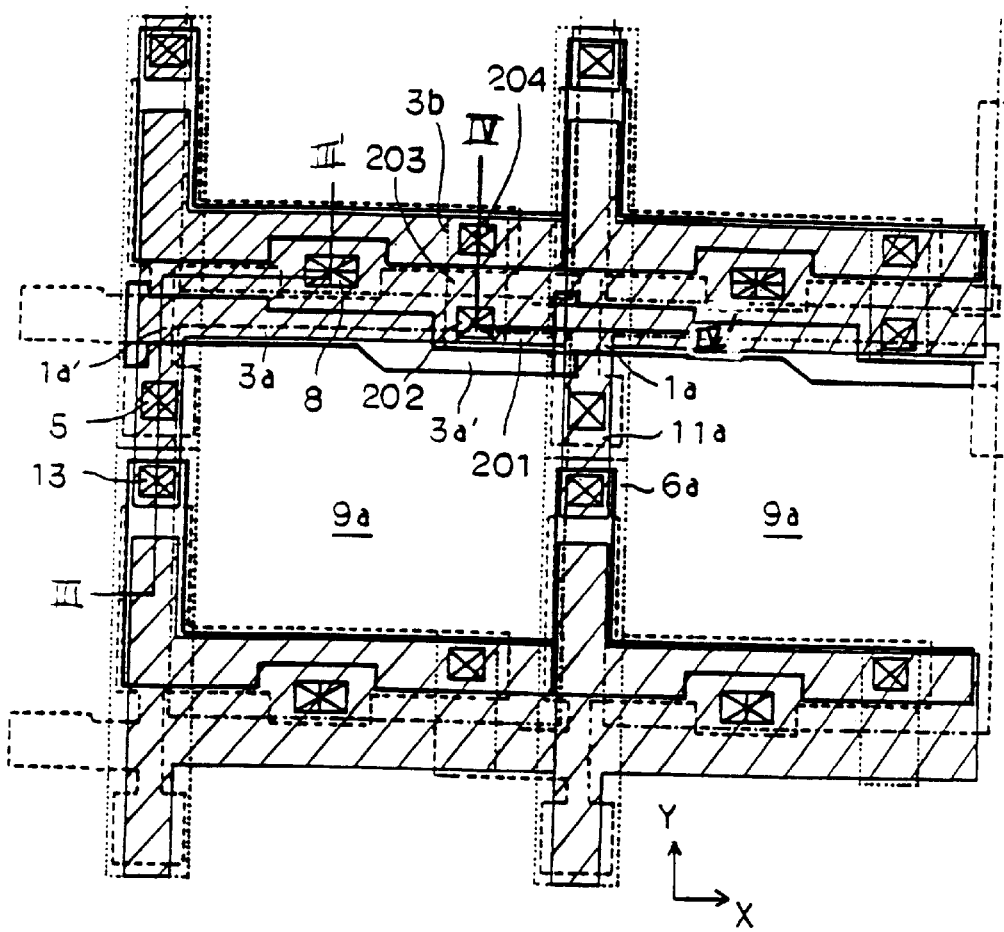

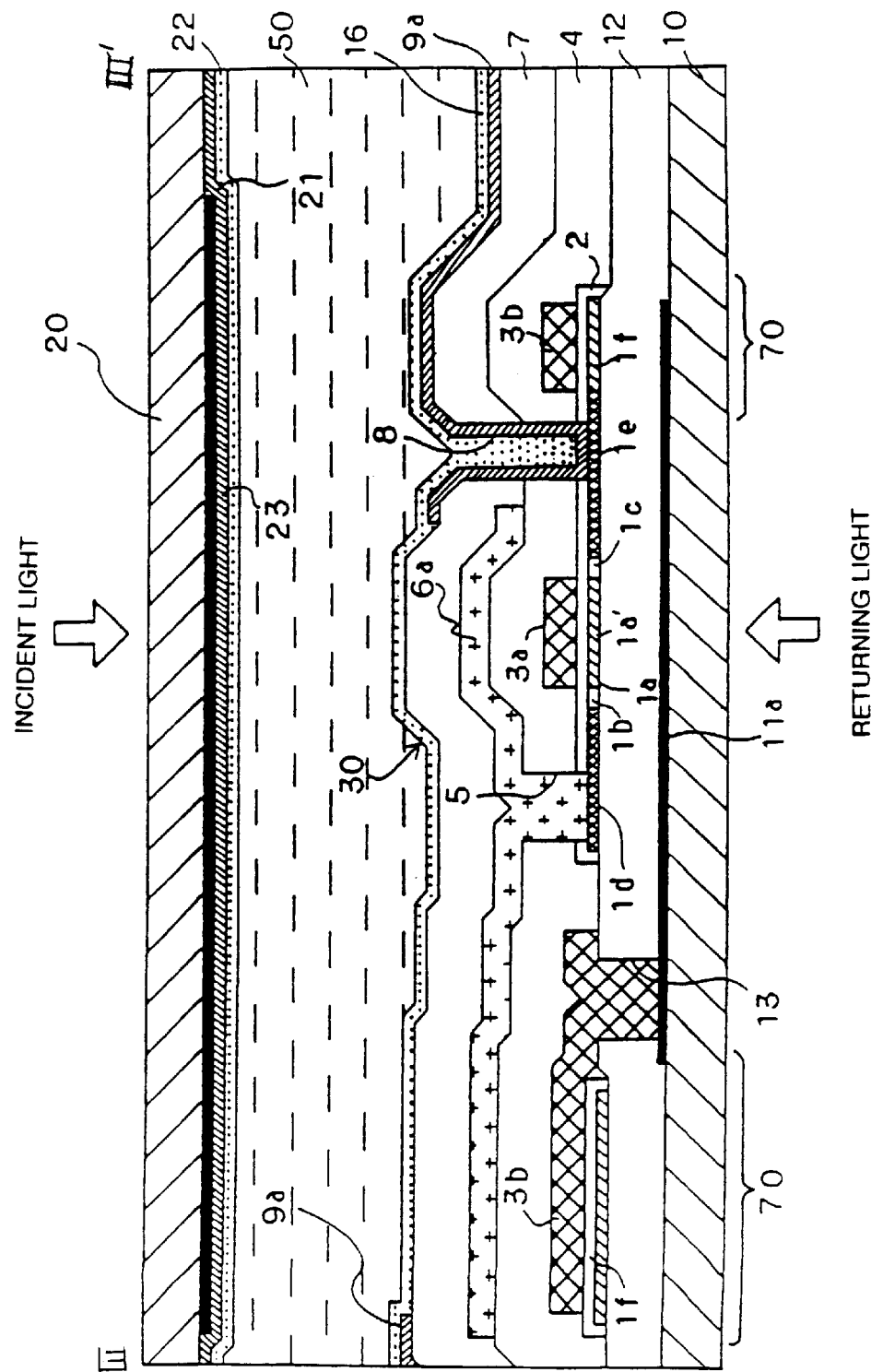

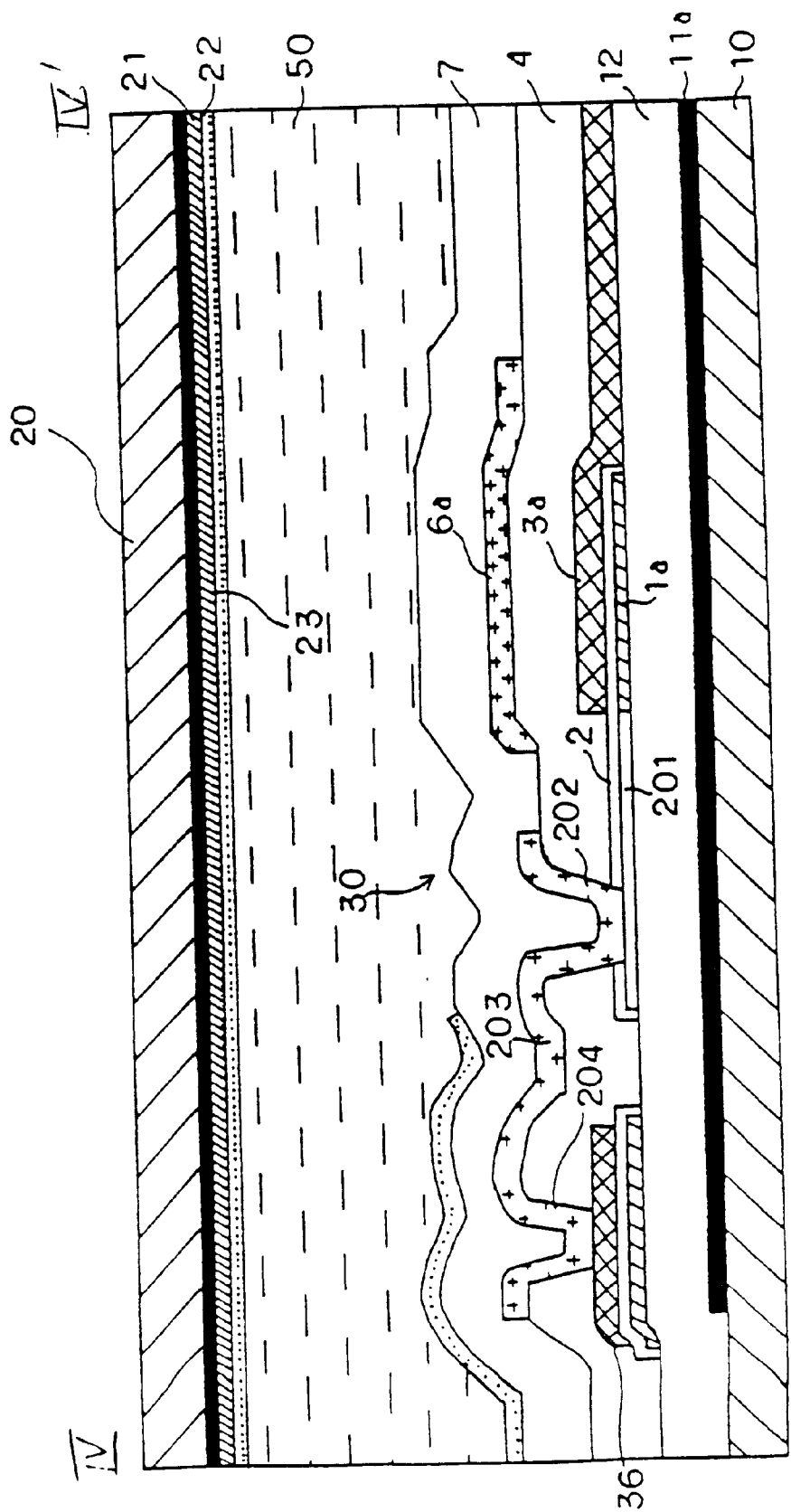
[Fig. 4]

[Fig. 5]
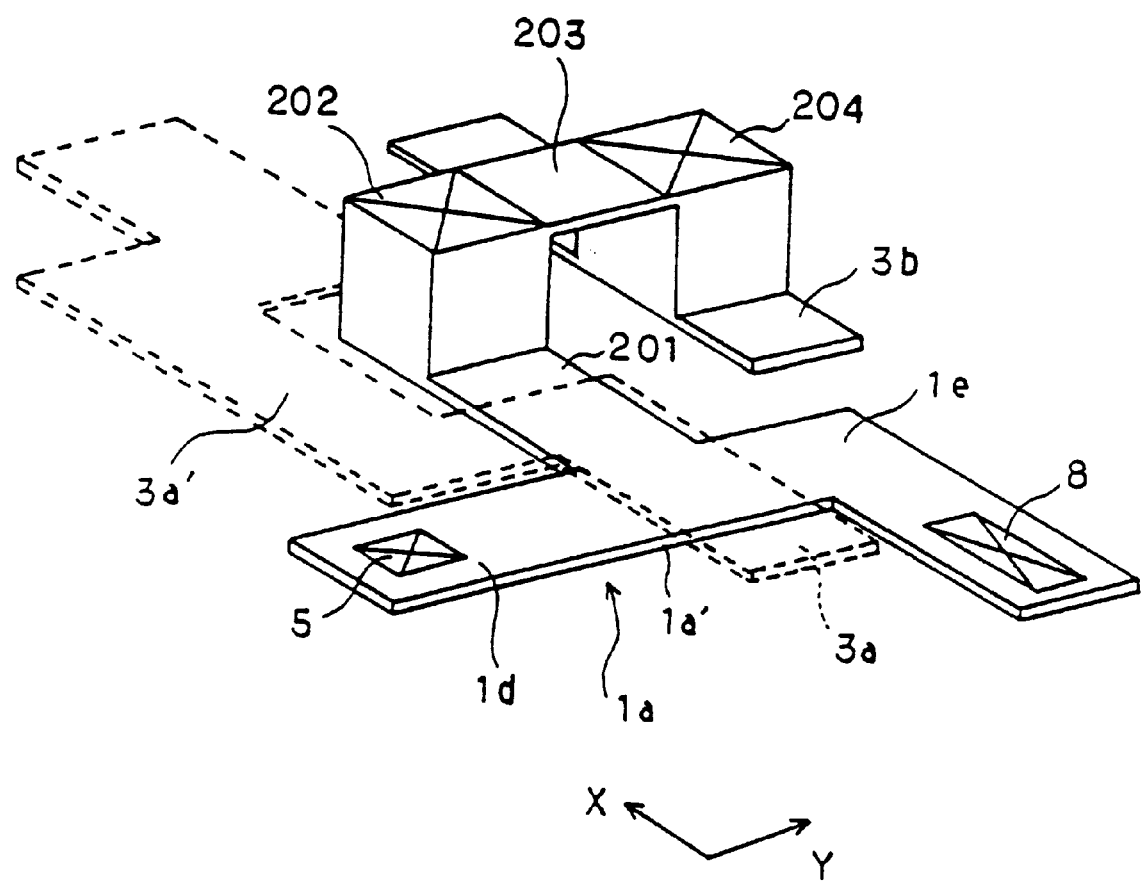

[Fig. 6]
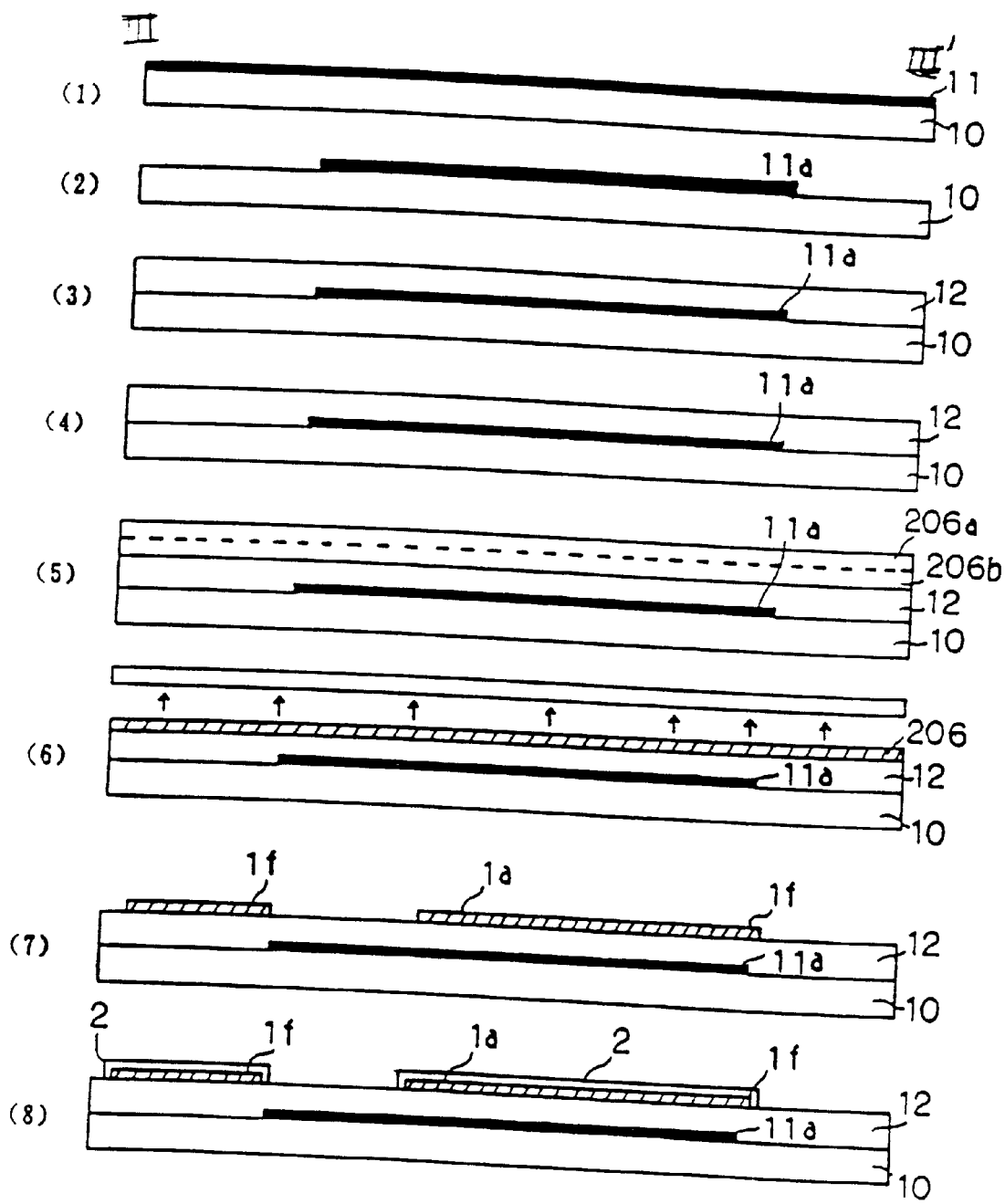

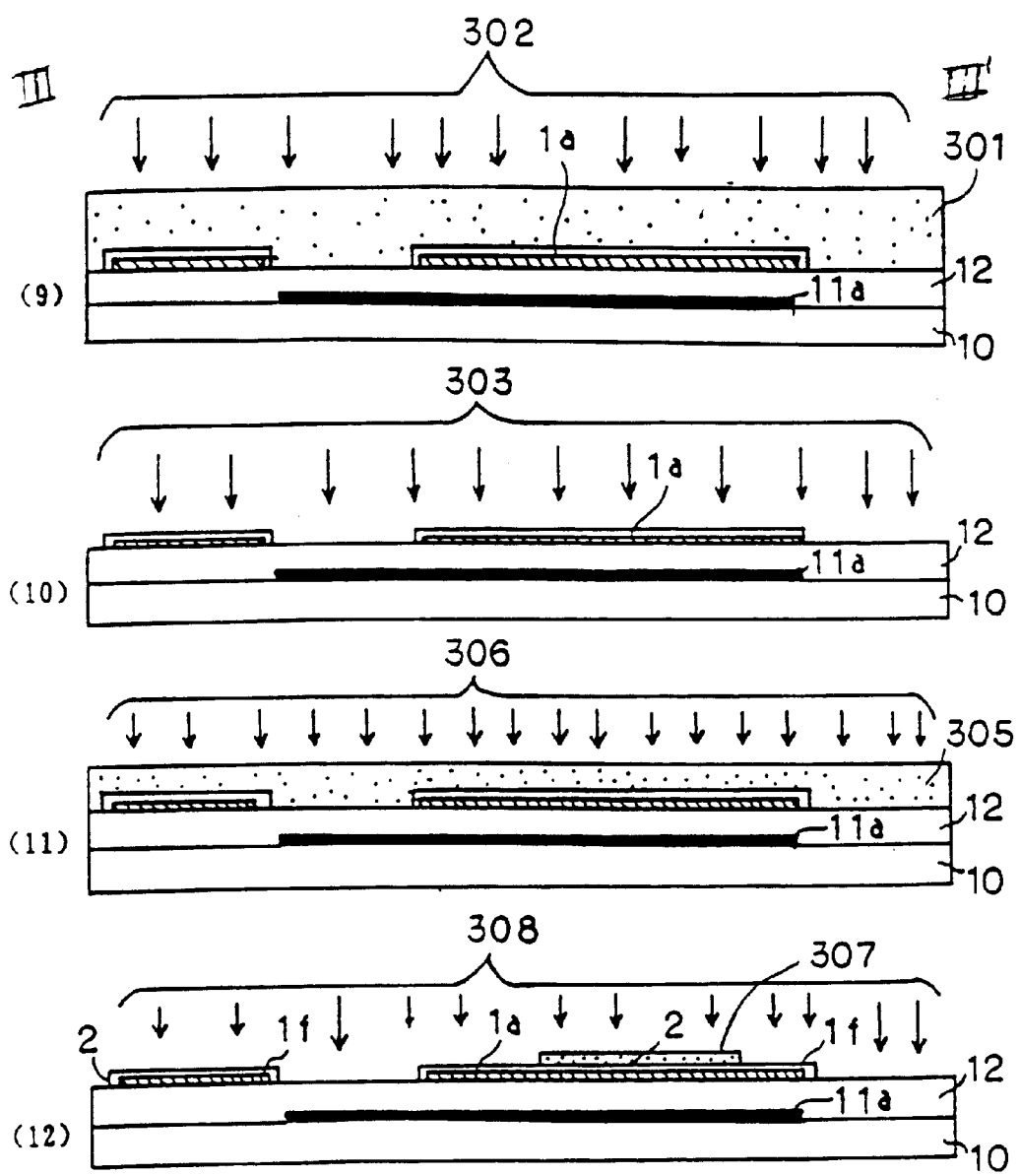
[Fig. 7]

[Fig. 8]
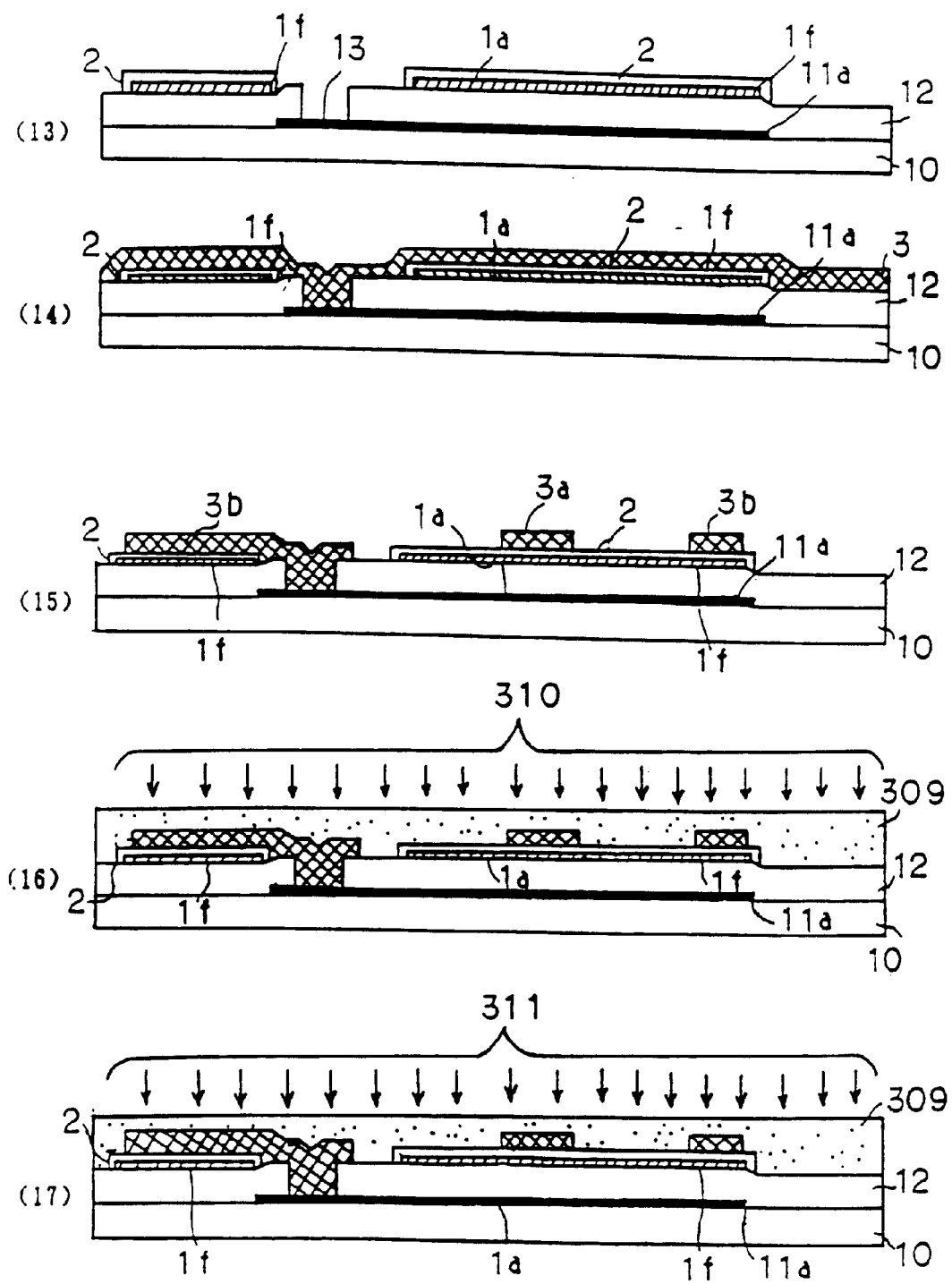

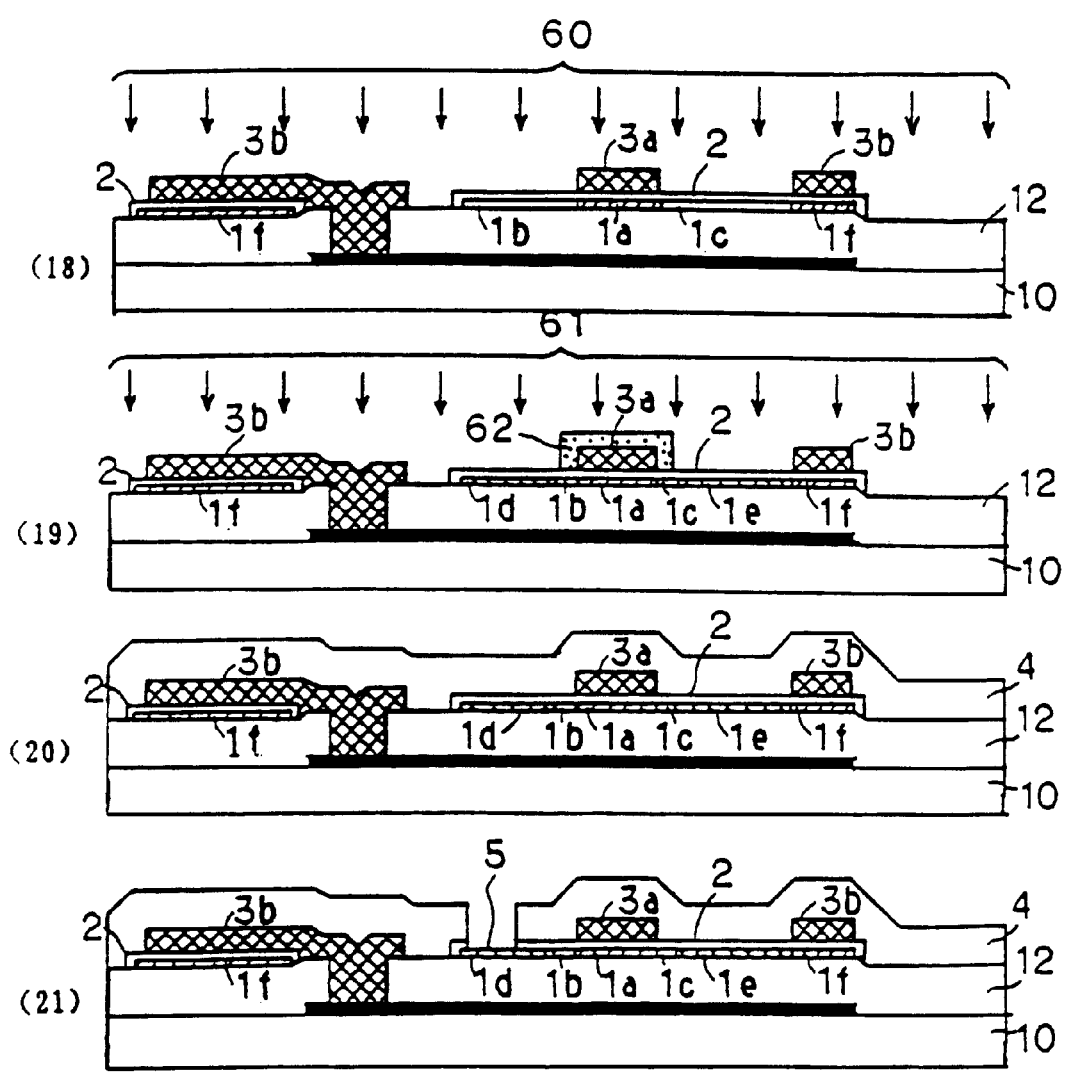
[Fig. 9]

[Fig. 10]
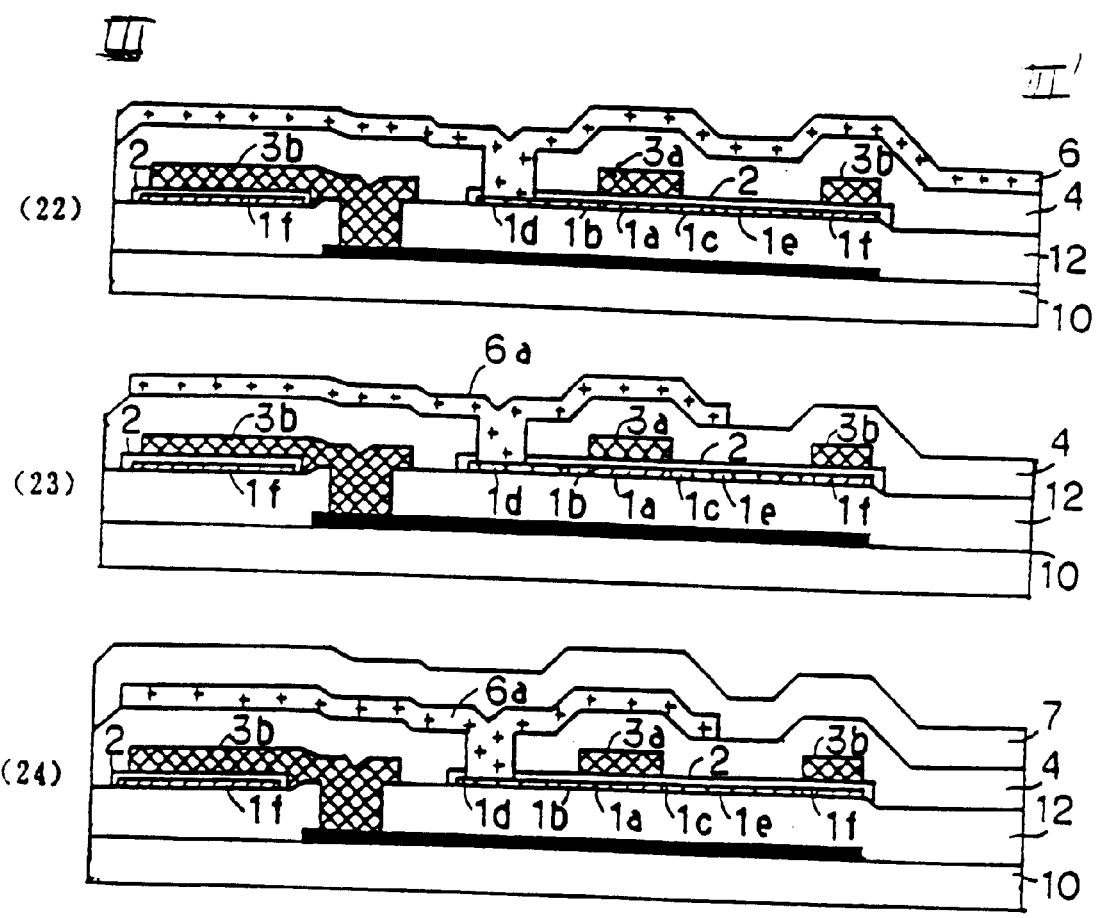

[Fig. 11]
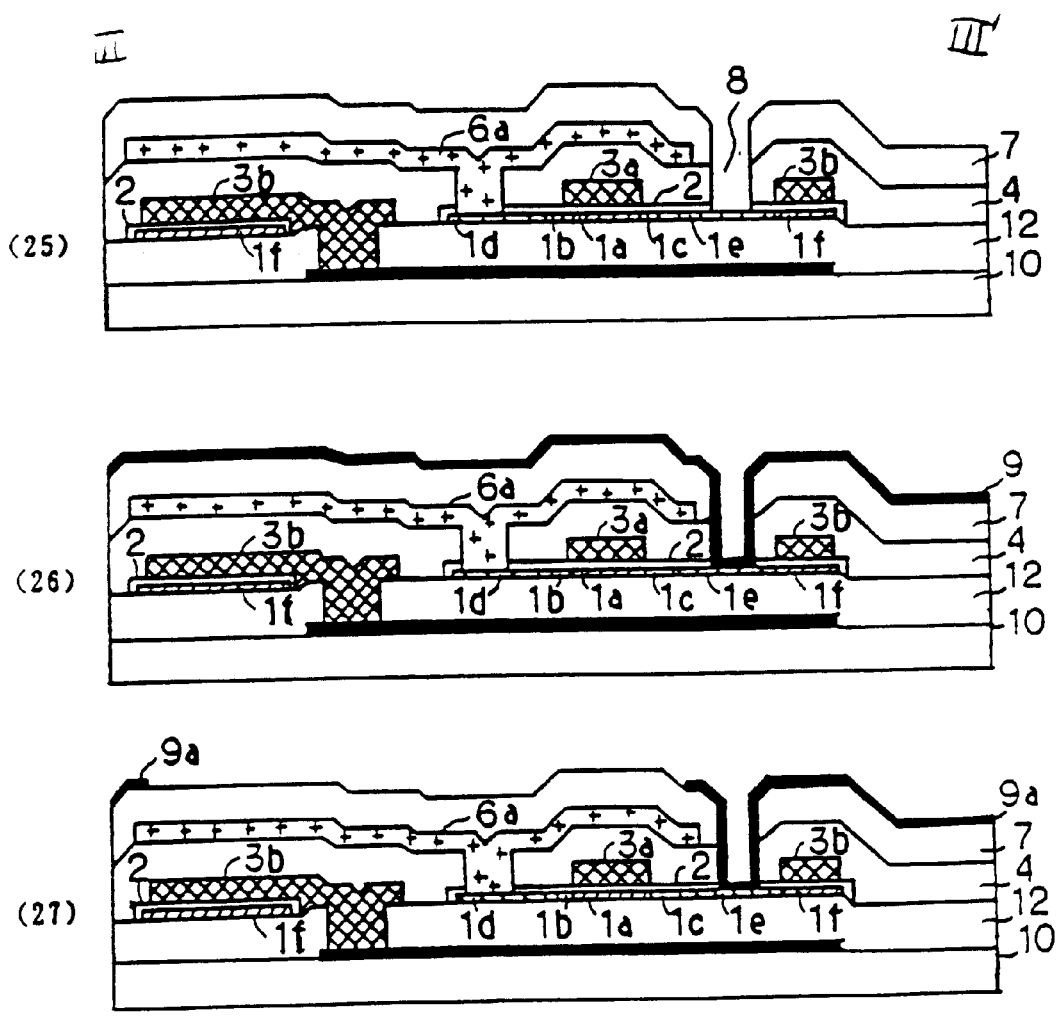

[Fig. 12]
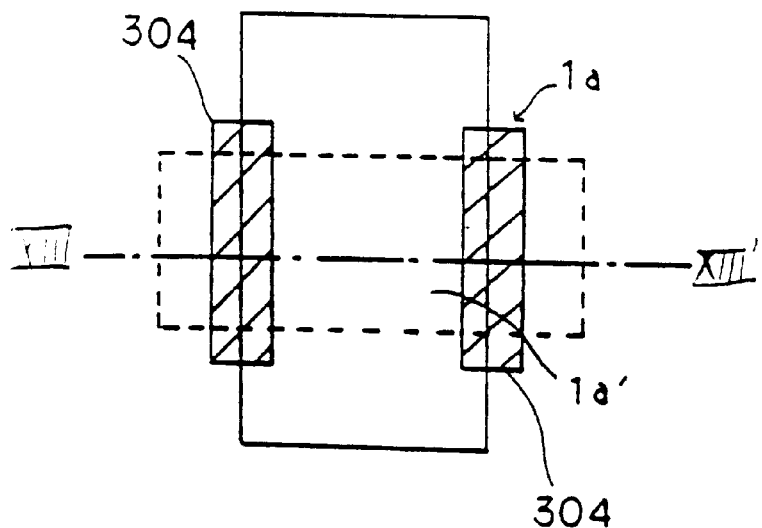
[Fig. 13]
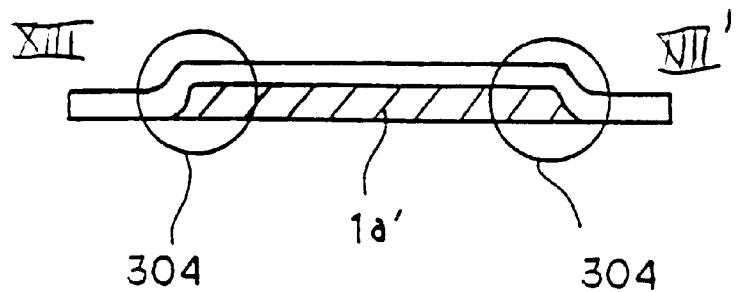

[Fig. 14]
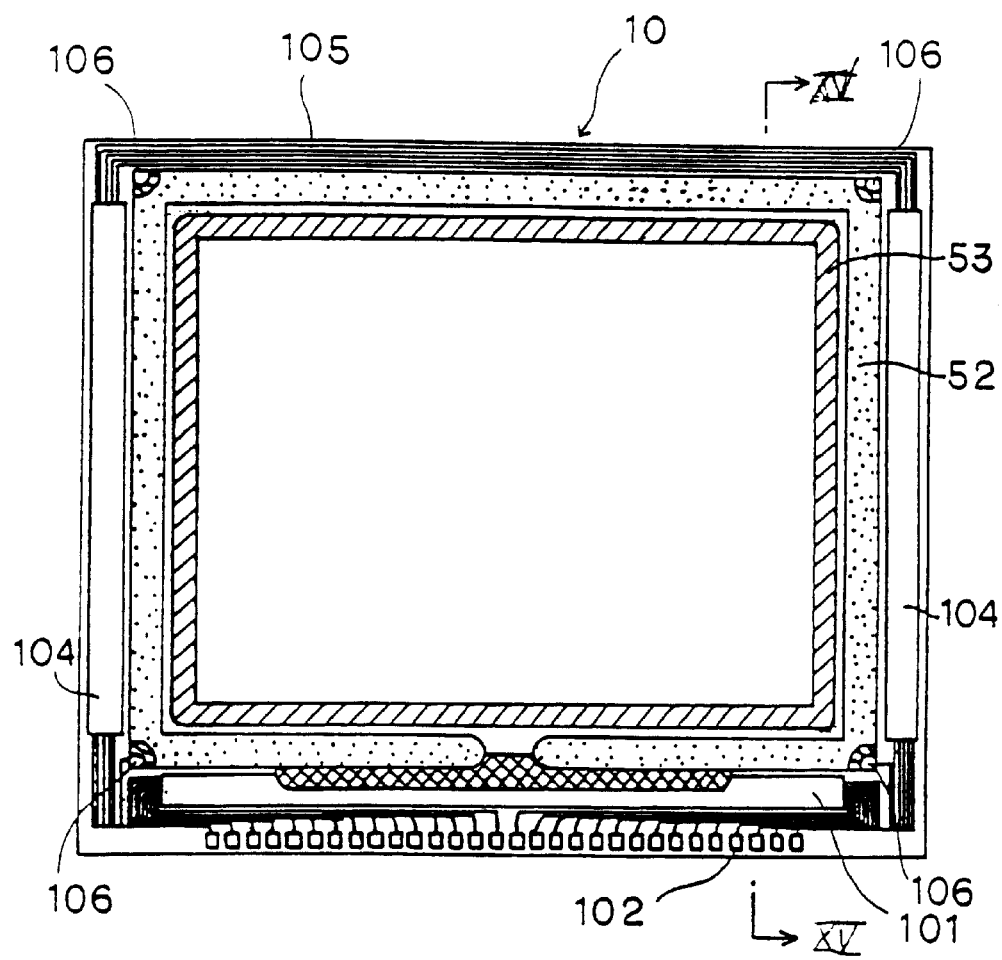
[Fig. 15]
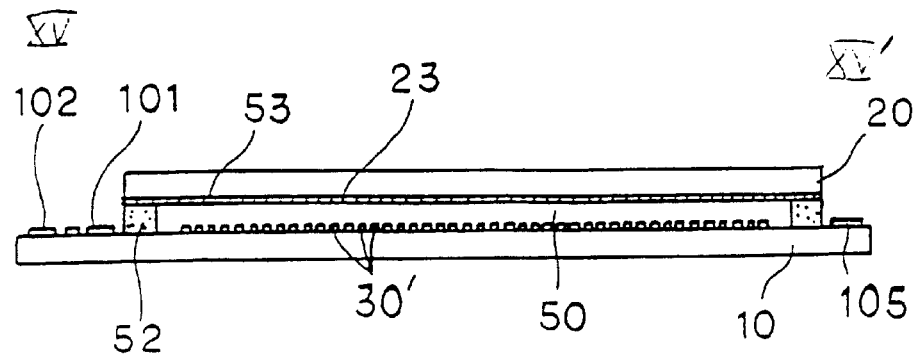

[Fig. 16]
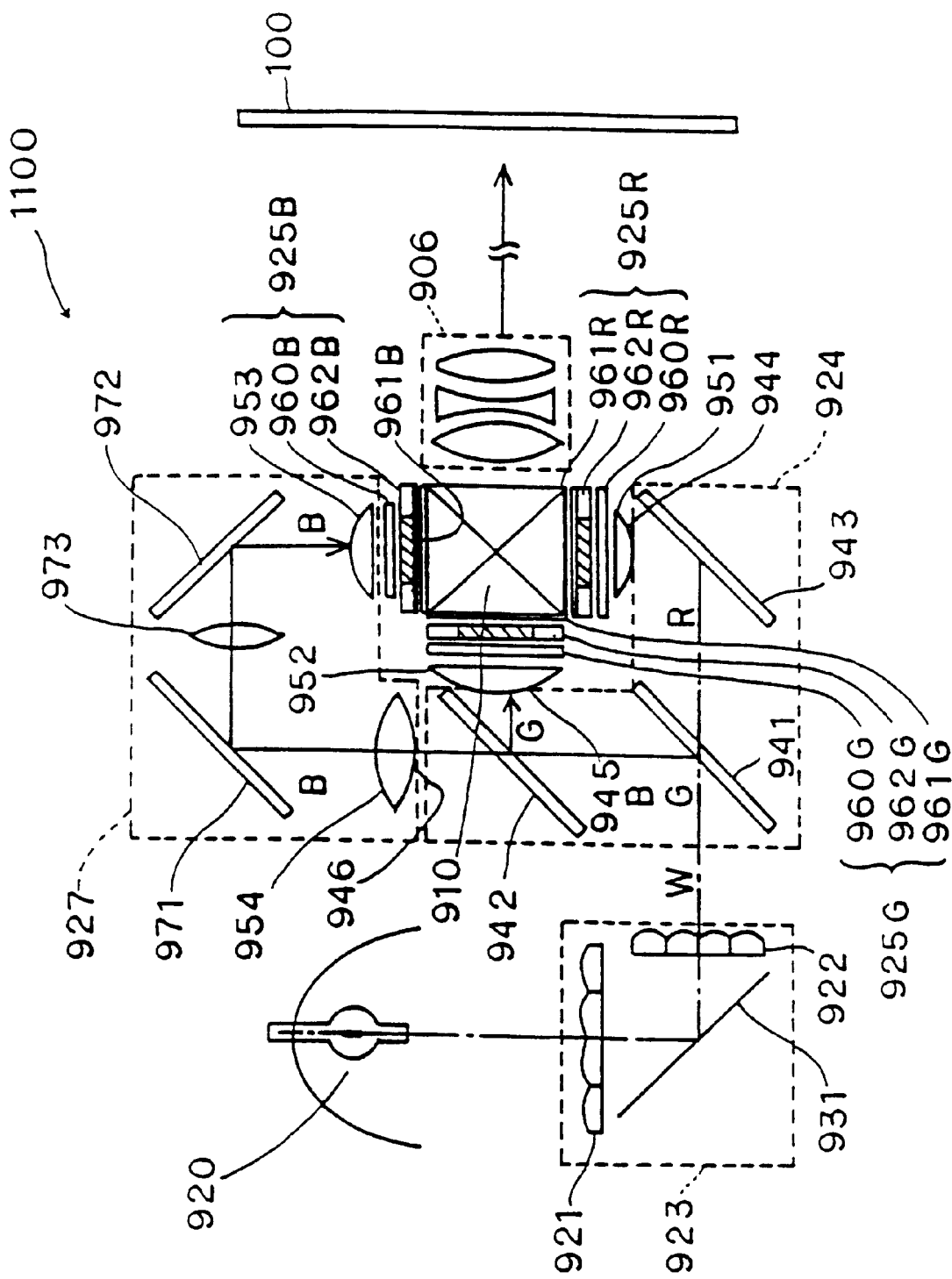

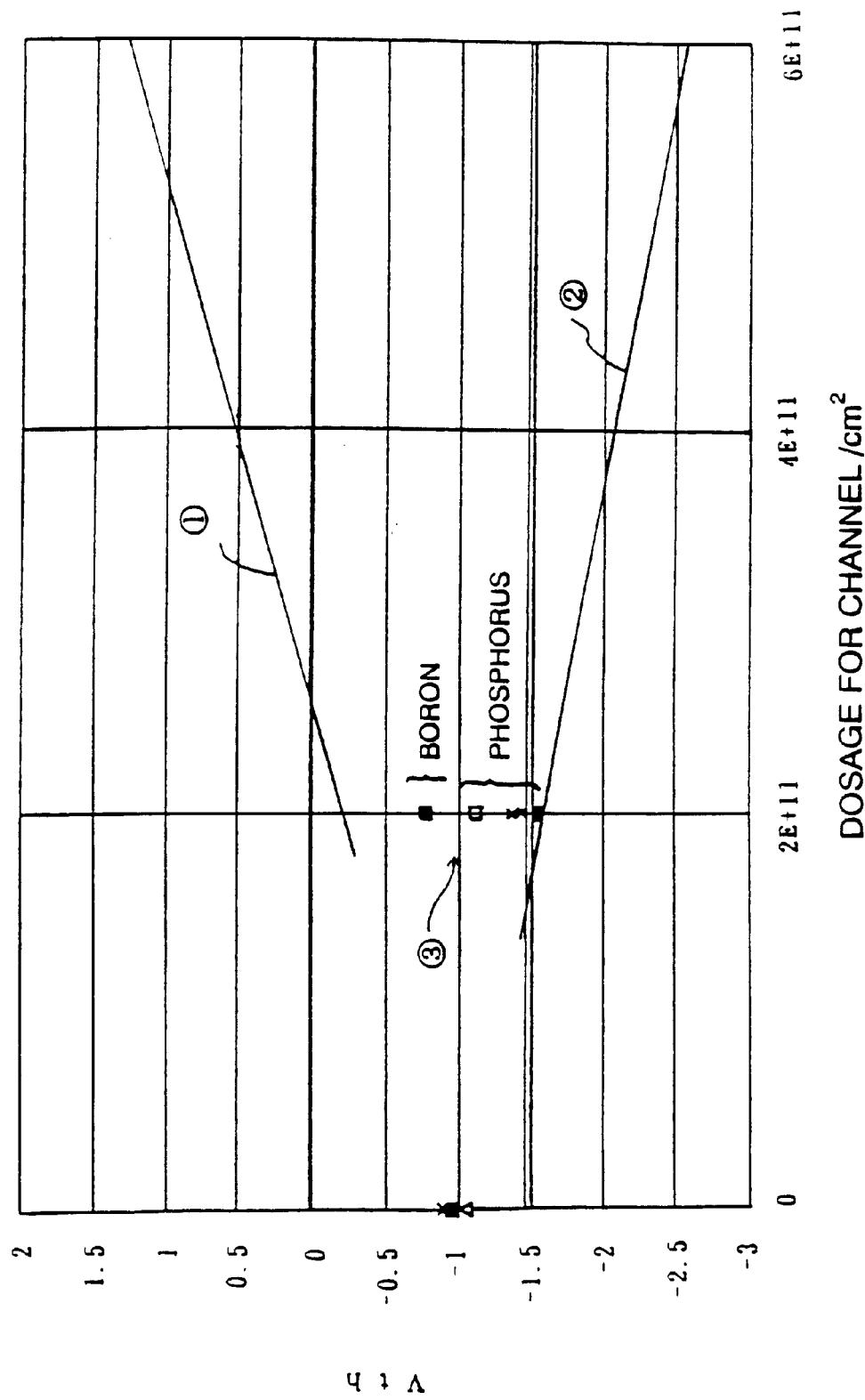
[Fig. 17]

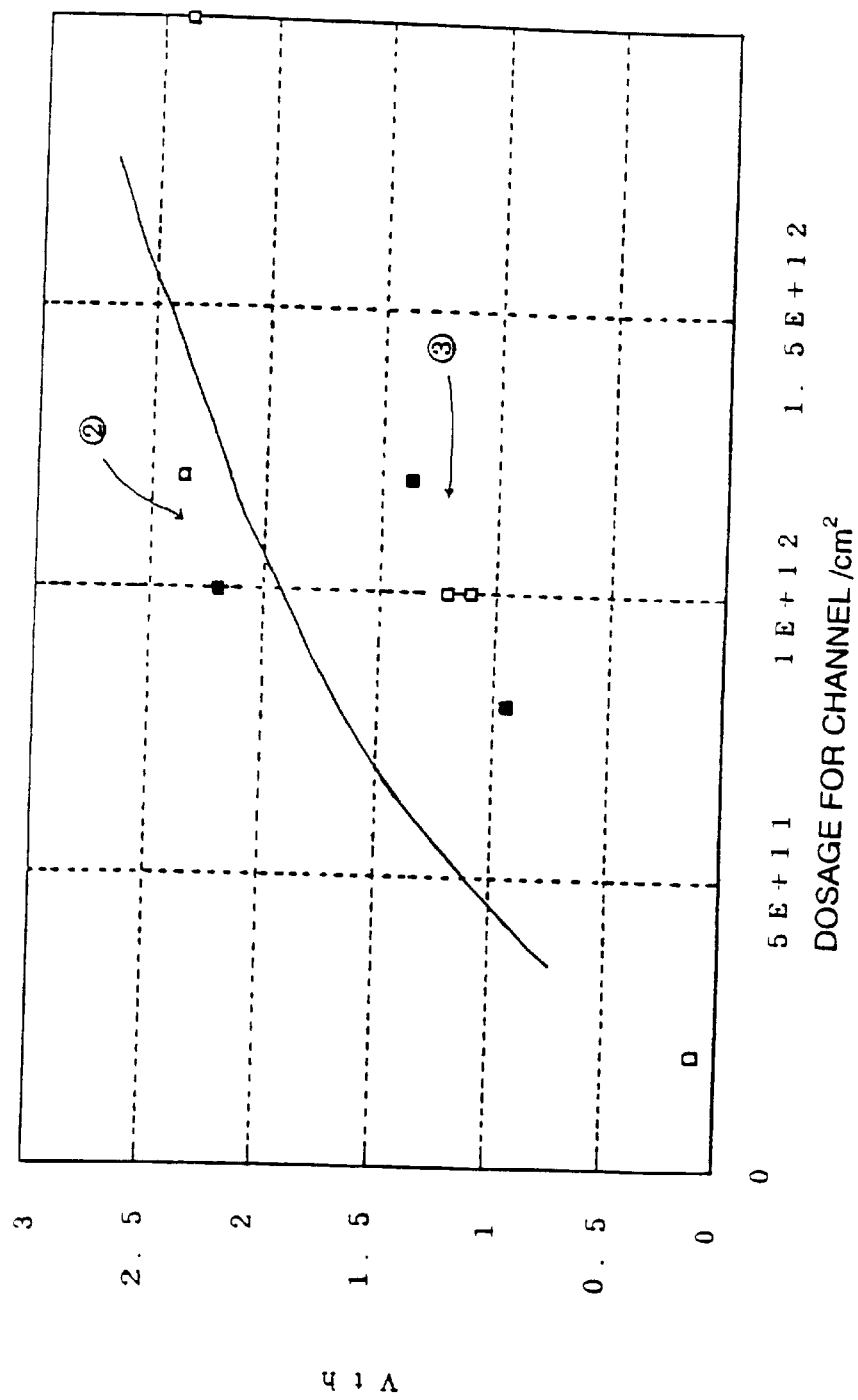
[Fig. 18]

[Fig. 19]
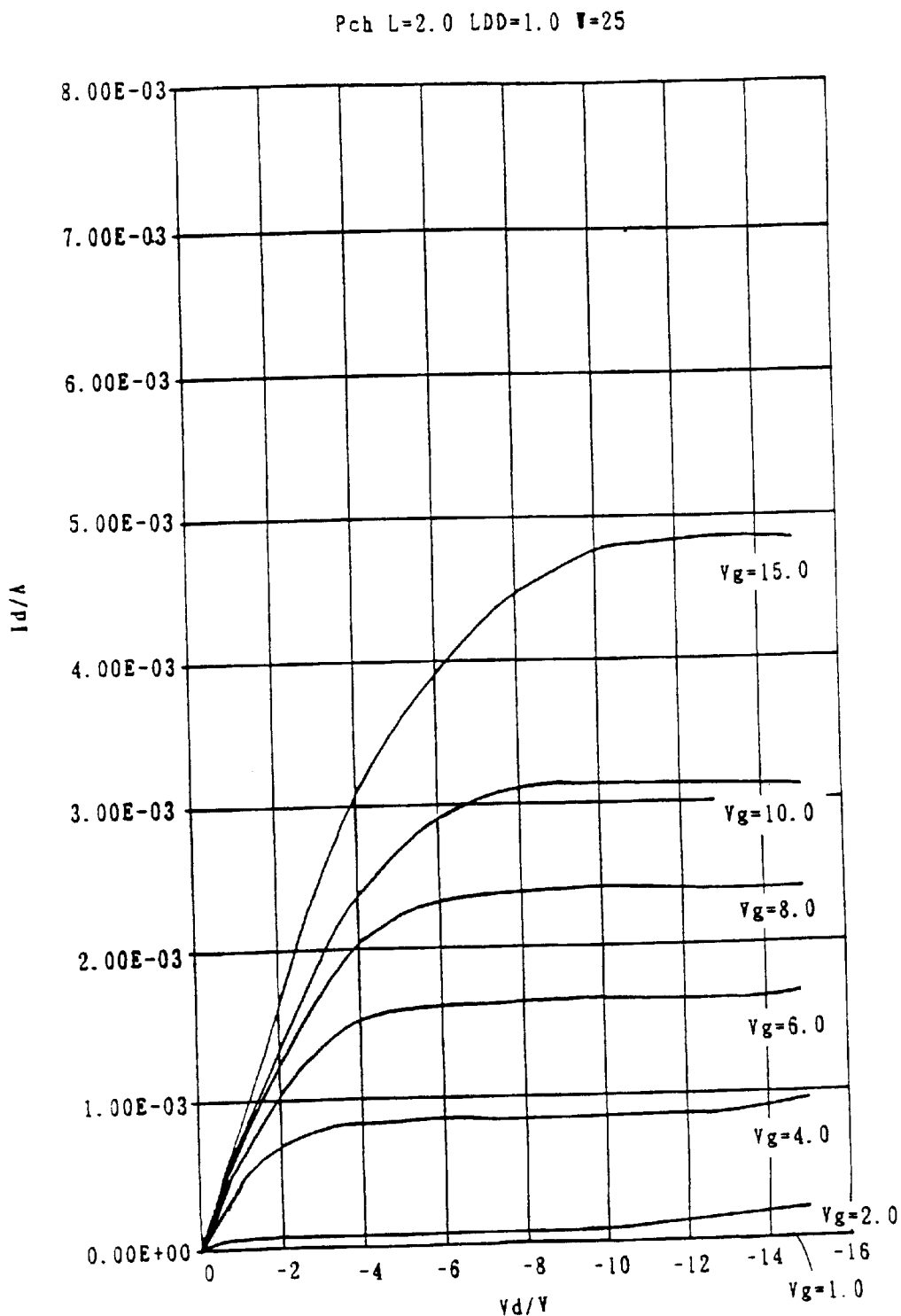

[Fig. 20]
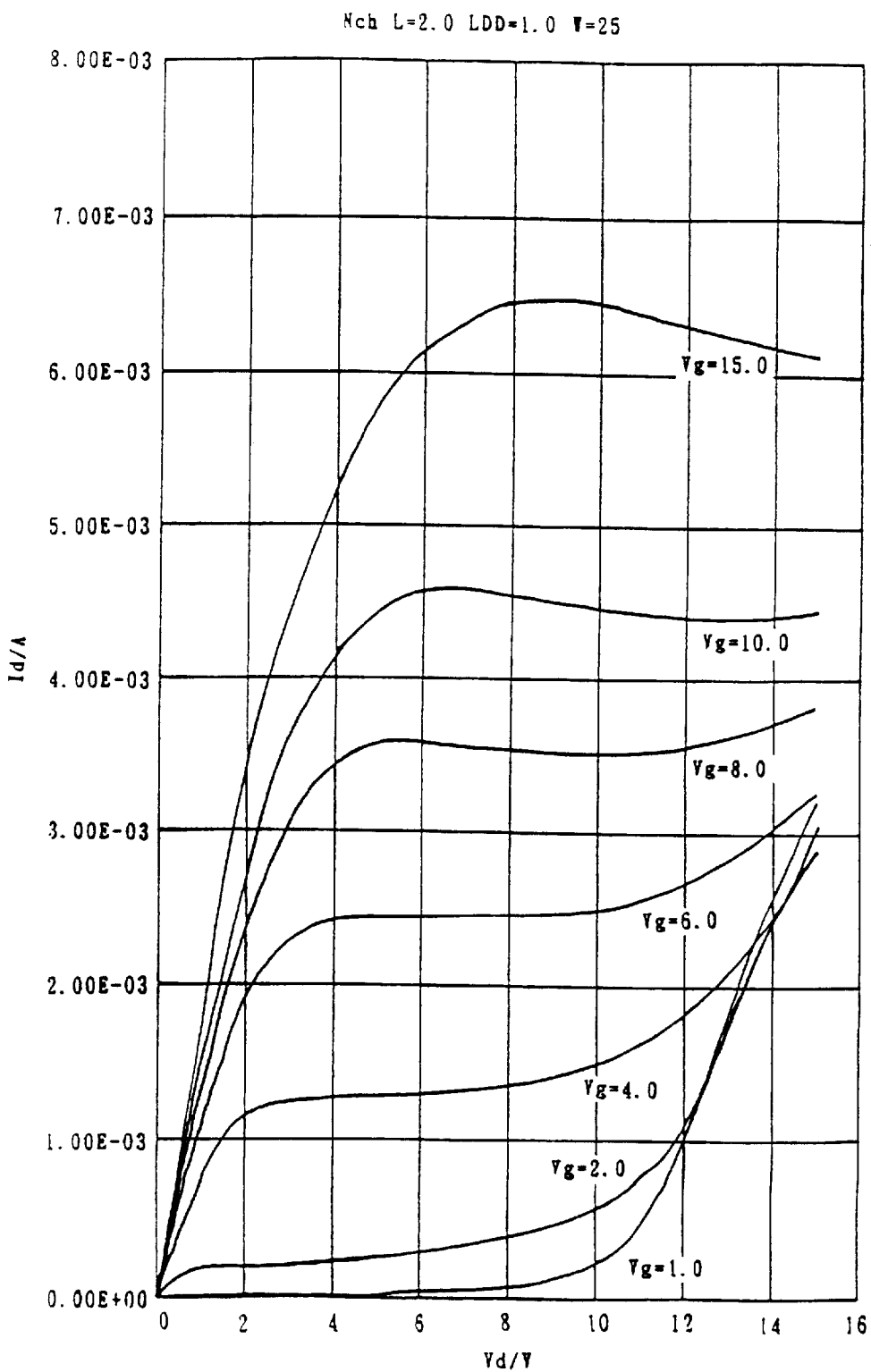

[Fig. 21]
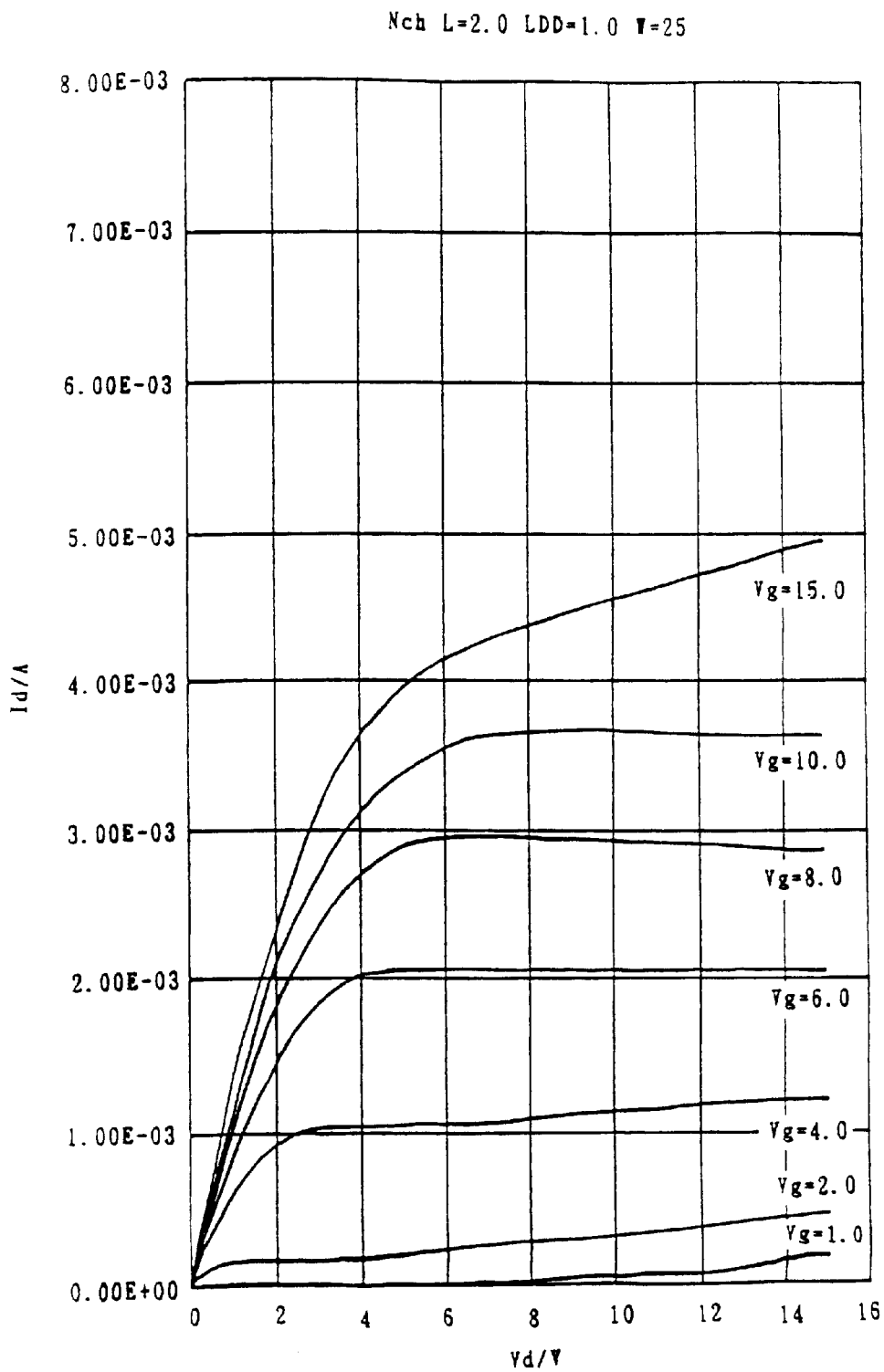

ELECTRO-OPTICAL DEVICE IN WHICH AN EXTENDING PORTION OF A CHANNEL REGION OF A SEMICONDUCTOR LAYER IS CONNECTED TO A CAPACITOR LINE AND AN ELECTRONIC APPARATUS INCLUDING THE ELECTRO-OPTICAL DEVICE

This is a Continuation-in-Part of application Ser. No. 09/219,708 filed Dec. 23, 1998, now U.S. Pat. No. 6,066,860 which in turn is a Continuation-In-Part of Ser. No. 09/215,172 filed Dec. 18, 1998. The entire disclosure of the prior applications is hereby incorporated by reference herein in its entirety.

BACKGROUND OF THE INVENTION

1. Field of Invention

The present invention relates to an electro-optical device consisting of a substrate provided with a semiconductor layer, to a method for making the electro-optical device, and to an electronic apparatus. In particular, the present invention relates to an electro-optical device in which a channel region of the semiconductor layer is connected to a capacitor line, to a method for making the electro-optical device, and to an electronic apparatus.

2. Description of Related Art

A silicon-on-insulator (SOI) technology, which includes the formation of a semiconductor layer composed of single-crystal silicon layer on an insulating substrate and of semiconductor devices such as transistor elements on the semiconductor layer, has advantages such as high-speed operation, low electrical power consumption and high-density integration of the elements. The SOI technology is applicable to electro-optical devices, for example, switching elements of a TFT array in a liquid crystal device.

In typical bulk semiconductor components, channel regions of transistor elements are maintained at a given potential by an underlying substrate. Thus, a parasitic bipolar effect generated by a change in potential in the channel region will not cause deterioration of electrical characteristics, such as a withstanding voltage.

SUMMARY OF THE INVENTION

In electro-optical devices such as liquid crystal devices, for example, transistor elements constituting switching elements in a TFT array may be completely isolated by an oxide insulating film. Hence, the channel regions in the transistor elements cannot be fixed at a given potential, and the channel regions are in an electrically floating state. In particular, when the transistor elements have a structure consisting of a single-crystal silicon layer, mobility of carriers moving in the channel may become high. Thus, collision of carriers accelerated by an electric field in the vicinity of the drain region with the crystal lattice may cause a phenomenon called impact ionization, and, for example, holes may be generated and accumulated in the bottom of the channel in an N-channel TFT. When charge is accumulated in the channel, the NPN structure of the TFT (in the case of the N-channel type) operates as an apparent bipolar element, resulting in deterioration of electrical characteristics, such as the source/drain withstanding voltage, of the element due to an extraordinary current. A series of phenomena caused by electrical floating of the channel regions are called substrate stray effects.

The present invention provides an electro-optical device which prevents deterioration of source/drain withstanding voltage by the substrate stray effects of transistor elements composed of a single-crystal silicon layer covered with an insulating film, and which can stabilize and improve electrical characteristics of the elements, a method for making the electro-optical device, and an electronic apparatus.

An electro-optical device in accordance with the present invention may consist of, on a substrate, a plurality of scanning lines, a plurality of data lines crossing the plurality of scanning lines, transistors connected to each of the scanning lines and to each of the data lines, pixel electrodes connected to the transistors, and storage capacitors, wherein an extending portion of a semiconductor layer functioning as a channel region of the transistor is connected to a capacitor line functioning as an electrode of the storage capacitor.

According to such a configuration in the present invention, the channel region of the semiconductor layer composed of a single-crystal silicon layer is connected to the capacitor line as an electrode of a storage capacitor, the channel region is maintained at a potential of the capacitor line, an extraordinary current in the transistor element is avoided, and electrical characteristics of the element are stabilized.

In the electro-optical device of the present invention, the extending portion and the capacitor line may be connected to each other by a connecting line via a first contact hole formed above the extending portion and a second contact hole formed on the capacitor line, and the scanning line and the capacitor line may lie in the same layer and have detour sections formed so as to detour around the first contact hole.

According to such a configuration of the present invention, the channel region of the semiconductor layer can be connected to the capacitor line while effectively using limited spaces. Since the connecting line and the contact holes can be simultaneously formed together with the data line, these can be formed using conventional production processes. Thus, in the electro-optical device of the present invention, the connecting line and the data line are preferably formed on the same layer.

In the electro-optical device of the present invention, the thickness of the semiconductor layer may lie in a range of 100 to 180 nm.

According to such a configuration of the present invention, the thickness of the semiconductor layer is greater than 100 nm. Thus, when the contact hole for connecting the pixel electrode to the drain region of the semiconductor layer, the contact hole will not pass through the semiconductor layer. Since the thickness of the semiconductor layer is less than 180 nm, the bumps of the device substrate due to the thickness of the semiconductor layer can be suppressed as much as possible. As a result, disclination when the liquid crystal is aligned can be suppressed and the display quality can be maintained at a satisfactory level.

In the electro-optical device of the present invention, a gate insulating film having a thickness of 450 nm to 650 nm may be inserted between the channel region of the semiconductor layer and a gate electrode region of the scanning line.

Since the thickness of the gate insulating film is greater than 450 nm according to such a configuration of the present invention, the liquid crystal can be driven by a required electrical power voltage without dielectric breakdown. Since the thickness of the gate insulating film is less than 650 nm, the gate capacitance can be increased so that the operating speed of the TFT elements, which is essential for driving the liquid crystal display device, can be ensured.

In the electro-optical device of the present invention, the impurity concentration at the edge of the channel region of the semiconductor layer may be higher than the impurity concentration of the other parts of the channel region.

Since the impurity concentration at the edge of the channel region of the semiconductor layer is higher than the impurity concentration of the other parts of the channel region according to such a configuration of the present invention, the apparent threshold voltage in this region is high. Thus, a leakage current can be prevented when the electric field from the gate electrode is concentrated in the edge of the channel region of the semiconductor layer.

In the electro-optical device, the thickness of the scanning line may lie in a range of 350 nm to 700 nm.

Since the thickness of the scanning line is greater than 350 nm according to such a configuration of the present invention, the wiring resistance can be reduced and a decreased in the writing rate of signals into pixels due to wiring delay can be sufficiently suppressed. Since the thickness of the scanning line is less than 550 nm, the bumps of the device substrate due to the thickness of the scanning line can be suppressed as much as possible. As a result, disclination when the liquid crystal is aligned can be suppressed and display quality can be maintained at a satisfactory level.

In the electro-optical device, the scanning line may consist of a polysilicon layer or at least two layers of a polysilicon and a conductive metal layer. According to such a configuration of the present invention, the conductivity can be enhanced; hence, a decrease in the writing rate of signals into pixels due to wiring delay can be sufficiently suppressed. In particular, the conductivity can be further enhanced in a scanning line composed of a polysilicon layer and a conductive metal layer. Thus, the formed scanning line has reduced wiring delay when the thickness is reduced, and the bumps of the device substrate due to the thickness can be suppressed as much as possible. As a result, disclination when the liquid crystal is aligned can be suppressed and display quality can be maintained at a satisfactory level.

In the electro-optical device of the present invention, an interlayer insulating layer having a thickness of 800 nm±200 nm may be inserted between the data lines and at least the scanning lines.

Since the thickness of the interlayer insulating layer is greater than 600 nm according to such a configuration of the present invention, capacitor coupling between the scanning line and the data line can be suppressed as much as possible and deterioration of writing characteristics of signals into pixels can be prevented. Since the thickness of the interlayer insulating layer is less than 1,000 nm, the throughput in the deposition step of the interlayer insulating layer can be improved.

In the electro-optical device of the present invention, the thickness of the data lines may lie in a range of 350 nm to 700 nm.

Since the thickness of the data line is greater than 350 nm according to such a configuration of the present invention, the wiring resistance can be reduced, and thus a decreased in the writing rate of signals into pixels due to wiring delay can be sufficiently suppressed. Since the thickness of the data line is less than 700 nm, the bumps of the device substrate due to the thickness of the data line can be suppressed as much as possible. Thus, disclination when the liquid crystal is aligned can be suppressed and display quality can be maintained at a satisfactory level.

In the electro-optical device of the present invention, an interlayer insulating layer having a thickness of 800 nm±200 nm may be inserted between the data lines and at least the pixel electrode.

Since the thickness of the interlayer insulating layer is greater than 600 nm according to such a configuration of the present invention, capacitance coupling between the data line and the pixel electrode can be suppressed as much as possible, and deterioration of writing characteristics of signals into pixels can be prevented. Since the thickness of the interlayer insulating layer is less than 1,000 nm, the throughput in the deposition step of the interlayer insulating layer can be improved.

The electro-optical device of the present invention may consist of a light-shielding layer provided between the substrate and the semiconductor layer.

According to such a configuration of the present invention, direct light incident on the rear surface of the substrate and light reflected by the rear surface of the substrate do not enter the transistor element forming regions. Thus, deterioration of writing characteristics of signals into pixels due to light leakage can be prevented.

In the electro-optical device of the present invention, the thickness of the light-shielding layer may lie in a range of 200 nm to 400 nm.

Since the thickness of the light-shielding layer is greater than 200 nm according to such a configuration of the present invention, the leakage current generated by the light reflected by the rear surface of the substrate can be suppressed to a level which does not affect writing characteristics into pixels. Since the thickness of the light-shielding layer is less than 400 nm, the bumps of the device substrate due to the thickness of the light-shielding layer can be suppressed as much as possible. As a result, disclination when the liquid crystal is aligned can be suppressed and display quality can be maintained at a satisfactory level.

A method for making an electro-optical device of the present invention may consist of forming a semiconductor layer functioning as a channel region, an extending portion of the channel region, and one electrode of a storage capacitor on a substrate, forming an insulating film on the semiconductor layer, forming a scanning line and a capacitor line functioning as another electrode of the storage capacitor on the insulating film, and connecting the extending portion to the capacitor line.

According to such a configuration of the present invention, the channel region and the capacitor line of the semiconductor layer are connected to each other. Thus, the channel region is fixed to a potential of the capacitor line, and problems, such as deterioration of the source-drain withstand voltage of the transistor element due to substrate stray effects which are produced by the SOI structure will not occur. The produced electro-optical device can have elements with stabilized electrical characteristics.

In the method for making an electro-optical device of the present invention, in the step for connecting the extending portion to the capacitor line, the extending portion and the capacitor line may be connected by a connecting line via a first contact hole formed on the extending portion and a second contact hole formed on the capacitor line, and a data line may be formed so as to be connected to the semiconductor layer via a third contact hole formed on the semiconductor layer.

According to such a configuration of the present invention, the connecting line and the data line can be simultaneously formed of the same material. Thus, the connecting line can be formed without additional steps. The method for making an electro-optical device of the present invention may further consist of, prior to forming the semiconductor layer, forming a light-shielding layer on the substrate at least at a position corresponding to the semiconductor layer.

According to such a configuration of the present invention, direct light incident on the rear surface of the substrate and light reflected by the rear surface of the substrate do not enter the transistor element forming regions. Thus, the produced electro-optical device does not cause deterioration of writing characteristics of signals into pixels due to light leakage.

In the method for making an electro-optical device of the present invention, forming the semiconductor layer may consist of bonding a single-crystal silicon substrate onto the substrate, and removing unnecessary parts of the bonded single-crystal silicon substrate to form another semiconductor layer consisting of single-crystal silicon.

In the method for making an electro-optical device of the present invention, the thickness of the semiconductor layer may lie in a range of 100 to 180 nm.

According to such a configuration of the present invention, the thickness of the semiconductor layer is greater than 100 nm. Thus, when the contact hole for connecting the pixel electrode to the drain region of the semiconductor layer, the contact hole will not pass through the semiconductor layer. Since the thickness of the semiconductor layer is less than 180 nm, the bumps of the device substrate due to the thickness of the semiconductor layer can be suppressed as much as possible. As a result, disclination when the liquid crystal is aligned can be suppressed and the display quality can be maintained at a satisfactory level.

In the method for making an electro-optical device of the present invention, in forming the insulating film, an n-type impurity may be implanted into a P channel of the semiconductor layer at a dosage of $1e11/cm^2$ to $4e11/cm^2$.

According to such a configuration of the present invention, the threshold voltage, which is an important switching property of TFT elements necessary for driving the liquid crystal device, can be appropriately controlled within an optimum practical range from −1.0 to −2.0 volts.

In the method for making an electro-optical device of the present invention, in forming the insulating film, a p-type impurity may be implanted into an N channel of the semiconductor layer at a dosage of $5e11/cm^2$ to $15e11/cm^2$.

According to such a configuration of the present invention, the threshold voltage, which is an important switching property of TFT elements necessary for driving the liquid crystal device, can be appropriately controlled within an optimum practical range from 1.0 to 2.0 volts.

The method for making an electro-optical device of the present invention may further consist of, prior to forming the insulating film, forming a gate insulating film on the semiconductor layer. The method for making an electro-optical device further consists of, subsequent to forming the insulating film, forming a gate insulating film on the semiconductor layer. This makes it possible to control the threshold voltage.

The method for making an electro-optical device of the present invention may further consist of, subsequent to forming the insulating film, implanting an n-type impurity into the channel edge of the P channel of the semiconductor layer and p-type impurity into the channel edge of the N channel of the semiconductor layer at a dosage of two to ten times that of the impurity implanted into the entire channel region.

According to such a configuration of the present invention, the impurity concentration at the channel edge of the semiconductor layer is higher than that of other portions in the channel region. Since the apparent threshold voltage is higher in this region, a leakage current does not flow when an electric field from the gate electrode is concentrated at the channel edge of the semiconductor layer.

In the electro-optical device of the present invention, the thickness of the scanning line may lie in a range of 350 nm to 700 nm.

In the method for making an electro-optical device of the present invention, in forming the scanning line and the capacitor line, a p-type impurity may be implanted into the P channel of the semiconductor layer at a dosage of $2e13/cm^2$ to $1e14/cm^2$ to form a lightly doped drain (LDD) region and a p-type impurity may be implanted into the semiconductor layer at a dosage of $5e14/cm^2$ to $2e15/cm^2$ to form a source/drain region.

According to such a configuration of the present invention, the electric field intensity has a moderate distribution in the vicinity of the drain by the presence of the LDD region. Thus, the withstanding voltage of the transistor element can be maintained at 10 volts or more which is an electrical source voltage necessary for driving the liquid crystal device. Since the sheet resistance and the contact resistance in the source and drain regions can be sufficiently suppressed, a decrease in the ON current due to parasitic resistance of the transistor elements can be suppressed.

In the method for making an electro-optical device of the present invention, in forming the scanning line and the capacitor line, an n-type impurity may be implanted into the N channel of the semiconductor layer at a dosage of $6e12/cm^2$ to $2.5e13/cm^2$ to form a lightly doped drain (LDD) region and an n-type impurity may be implanted into the semiconductor layer at a dosage of $1e15/cm^2$ to $4e15/cm^2$ to form a source/drain region.

According to such a configuration of the present invention, the electric field intensity has a moderate distribution in the vicinity of the drain by the presence of the LDD region. Thus, the withstanding voltage of the transistor element can be maintained at 10 volts or more which is an electrical source voltage necessary for driving the liquid crystal device. Since the sheet resistance and the contact resistance in the source and drain regions can be sufficiently suppressed, a decrease in the ON current due to parasitic resistance of the transistor elements can be suppressed.

In the method for making an electro-optical device of the present invention, an activation annealing treatment is performed at a temperature in a range of 800° C. to 900° C. subsequent to forming the scanning line and the capacitor line.

According to such a configuration of the present invention, impurities implanted in the LDD region and the source and drain regions can be activated. When the temperature is less than 800° C., the implanted impurities cannot be activated. When the temperature is greater than 900° C., the impurities are significantly diffused in the transverse direction during the annealing treatment and the impurity profile having the LDD structure which is necessary for securing the withstand voltage of the transistor elements cannot be formed.

In the method for making an electro-optical device of the present invention, the capacitor line and a scanning line may be simultaneously formed in connecting the extending portion to the capacitor line.

According to such a configuration of the present invention, the production process can be simplified.

The method for making an electro-optical device of the present invention may consist of forming a first contact hole connected to the extending portion and a second contact hole connected to the capacitor line, and forming a connecting line for connecting the first contact hole to the second contact hole.

According to such a configuration of the present invention, the extending portion and the capacitor line can be connected to each other without additional steps.

In the method for making an electro-optical device of the present invention, the connecting line and a data line may be simultaneously formed.

According to such a configuration of the present invention, the connecting line can be formed without additional steps.

The electro-optical device of the present invention may further consist of a second substrate opposing the surface of the substrate provided with the semiconductor layer, and a liquid crystal disposed between the two substrates and driven by transistor elements formed in the semiconductor layer.

An electronic apparatus of the present invention may consist of a light source, the above described electro-optical device for modulating light emitted from the light source in response to image information, and a projection device for projecting the light modulated by the electro-optical device.

BRIEF DESCRIPTION OF THE DRAWINGS

FIG. 1 shows an equivalent circuit including various elements and lead lines provided in a plurality of pixels formed in a matrix which constitutes an image forming region of a liquid crystal device in accordance with an embodiment of the present invention;

FIG. 2 is a plan view of a plurality of adjacent pixels on a TFT array substrate provided with data lines, scanning lines, pixel electrodes, and light-shielding films, in an embodiment of the liquid crystal device;

FIG. 3 is a cross-sectional view taken from line III–III' in FIG. 2;

FIG. 4 is a cross-sectional view taken from line IV–IV' in FIG. 2;

FIG. 5 is a perspective view conceptually showing a structure in the vicinity of a semiconductor layer in FIGS. 2 to 4;

FIG. 6 is a process chart (No. 1) sequentially showing production processes in accordance with an embodiment of a liquid crystal device;

FIG. 7 is a process chart (No. 2) sequentially showing production processes in accordance with an embodiment of a liquid crystal device;

FIG. 8 is a process chart (No. 3) sequentially showing production processes in accordance with an embodiment of a liquid crystal device;

FIG. 9 is a process chart (No. 4) sequentially showing production processes in accordance with an embodiment of a liquid crystal device;

FIG. 10 is a process chart (No. 5) sequentially showing production processes in accordance with an embodiment of a liquid crystal device;

FIG. 11 is a process chart (No. 6) sequentially showing production processes in accordance with an embodiment of a liquid crystal device;

FIG. 12 is a partial plan view of a channel region of a semiconductor layer in a liquid crystal device;

FIG. 13 is a cross-sectional view taken from line XIII–XIII' in FIG. 12;

FIG. 14 is a plan view of a TFT array substrate with constituents formed thereon when viewed from an opposing substrate side in each embodiment of a liquid crystal device;

FIG. 15 is a cross-sectional view taken from line XV–XV' in FIG. 14;

FIG. 16 is a schematic diagram of a projector as an example of electronic apparatuses using liquid crystal devices;

FIG. 17 is a graph of the relationship between the threshold voltage Vth and the dosage in a P channel;

FIG. 18 is a graph of the relationship between the threshold voltage Vth and the dosage in an N channel;

FIG. 19 is a graph of voltage versus current characteristics of a P-channel semiconductor layer;

FIG. 20 is a graph of voltage versus current characteristics (No. 1) of an N-channel semiconductor layer;

FIG. 21 is a graph of voltage versus current characteristics (No. 2) of an N-channel semiconductor layer.

DETAILED DESCRIPTION OF PREFERRED EMBODIMENTS

Figure 22:
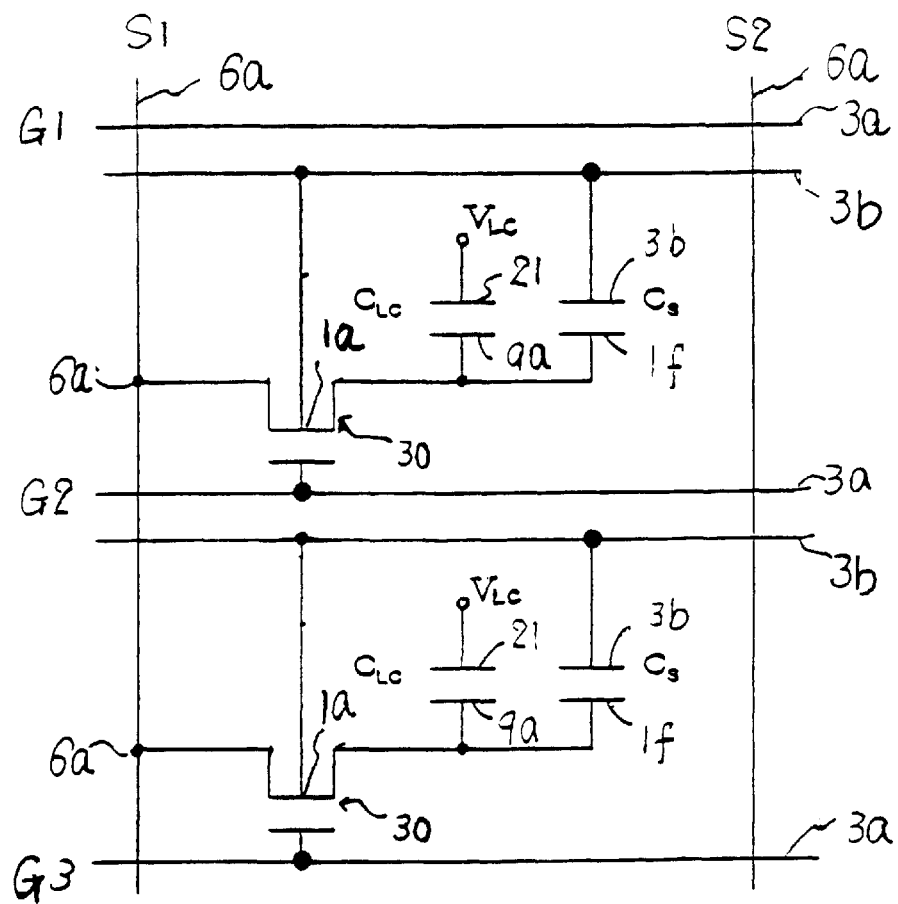
FIG. 22 shows an equivalent circuit including various elements and lead lines provided in a plurality of pixels formed in a matrix which constitutes an image forming region of a liquid crystal device in accordance with an embodiment of the present invention.

Embodiments in accordance with the present invention will now be described with reference to the drawings.

FIG. 1 shows an equivalent circuit including various elements and lead lines in a plurality of pixels formed in a matrix which constitutes an image forming region of a liquid crystal device as an electro-optical device in accordance with an embodiment of the present invention. FIG. 2 is a plan view of a plurality of adjacent pixels on a TFT array substrate provided with data lines, scanning lines, pixel electrodes, and light-shielding films. FIG. 3 is a cross-sectional view taken from line III–III' in FIG. 2, and FIG. 4 is a cross-sectional view taken from line IV–IV' in FIG. 2. FIG. 5 is a perspective view conceptually showing a structure in the vicinity of a semiconductor layer in the liquid crystal device. In FIGS. 3, 4 and 5, each layer and each component are depicted using different scales so that these can be distinguished in the drawings. In FIGS. 2 and 5, the X direction indicates a direction parallel to the scanning lines and the Y direction indicates a direction parallel to the data lines.

In FIG. 1, the plurality of pixels formed in a matrix constituting the image display region of the liquid crystal device in accordance with this embodiment includes a plurality of pixel electrodes 9a formed in a matrix, and TFTs 30 as transistors for controlling the pixel electrodes 9a. Data lines 6a for supplying image signals are electrically connected to sources of the TFTs 30. Image signals S1, S2, . . . , Sn written into the data lines 6a may be supplied sequentially to these lines or simultaneously to plural adjacent data lines 6a as a group. Scanning lines 3a are electrically connected to gates of the TFTs 30 so as to apply pulse scanning signals G1, G2, . . . , Gm to the scanning lines 3a at a given timing, in this order. The pixel electrodes 9a are electrically connected to the drains of the TFTs 30 and perform writing of the image signals S1, S2, . . . , Sn fed from the data lines 6a at a given timing by turning off the TFTs 30, which are switching elements, for a given period. The image signals S1, S2, . . . , Sn having a predetermined level applied to a liquid crystal via the pixel electrodes 9a are maintained between the pixel electrodes 9a and a counter electrode (to be described below) formed on a counter substrate (to be described below). Changes in alignment and ordering of the molecular aggregate of the liquid crystal depending on the level of the applied voltage cause modulation of light and enable gray scale display. In a normally-white mode, incident light does not pass through the liquid crystal in response to the applied voltage. In a normally-black mode, incident light passes through the liquid crystal in response to the applied voltage. On the whole, light having a contrast in response to an image signal is emitted from the liquid crystal device. In order to avoid leakage of the retained image signals, storage capacitors 70 are provided in parallel with a liquid crystal capacitance formed between the pixel electrodes 9a and the counter electrode. Maintaining characteristics are thereby further improved and the resulting liquid crystal device has a high contrast. In this embodiment, low-resistance capacitor lines 3b are provided in the same layer as the scanning lines or by using a conductive light-shielding film, as described later.

In FIG. 2, a plurality of the transparent pixel electrodes 9a in a matrix (the outline is shown by chain lines) is provided on the TFT array substrate of the liquid crystal device. The data lines 6a, scanning lines 3a, and capacitor lines 3b are provided along the corresponding vertical or horizontal boundaries of the pixel electrodes 9a. Each data line 6a is electrically connected to a source region (described below) of a semiconductor layer 1a of single-crystal silicon via a contact hole 5, and each pixel electrode 9a is electrically connected to a drain region (described below) of the semiconductor layer 1a via a contact hole 8. Each scanning line 3a is provided so as to face a channel region (described later) of the semiconductor layer 1a and functions as a gate electrode.

The capacitor line 3b has a substantially linear main section (a first region along the scanning line 3a in a plan view) extending along the scanning line 3a, and a projecting section (a second region extending along the data line 6a in a plan view) projecting from the intersection with the data line 6a toward the previous side (the upper side in the drawing) along the data line 6a.

In a region shaded with right-slanting lines in the drawing, a plurality of first light-shielding films 11a is provided. In detail, each first light-shielding film 11a is provided at a position which covers the TFT including the channel region of the semiconductor layer 1a in the pixel section when viewed from the TFT array substrate side. The first light-shielding film 11a has a linear main section extending along the scanning line 3a which faces the main section of the capacitor line 3b, and a projecting section projecting along the data line 6a from the intersection with the data line 6a towards the lower side in the drawing. The edge of the downward projecting section of the first light-shielding film 11a at each step (pixel line) overlaps the edge of the projecting section of the upward projecting section of the capacitor line 3b at the next step, below the data line 6a. A contact hole 13 for electrically connecting the first light-shielding film 11a and the capacitor line 3b is provided in this overlapping section. That is, in this embodiment, the first light-shielding film 11a is electrically connected to the capacitor line 3b at the previous or next step via the contact hole 13.

As shown in the cross-sectional view in FIG. 3, the liquid crystal device is provided with a TFT array substrate 10, as an example of a light-transmissive substrate, and an opposing transparent substrate 20. The TFT array substrate 10 is composed of, for example, a quartz substrate, and the opposing substrate 20 is composed of, for example, a glass substrate or a quartz substrate. The TFT array substrate 10 is provided with pixel electrodes 9a and alignment layers 16 thereon, which have been subjected to a given alignment treatment, such as a rubbing treatment. Each pixel electrode 9a is composed of, for example, a transparent conductive thin-film such as an indium tin oxide (ITO) film. Each alignment layer 16 is composed of, for example, an organic thin-film such as a polyimide thin-film.

On the other hand, a counter electrode (common electrode) 21 is provided on the entire opposing substrate 20, and an alignment layer 22, which has been subjected to an alignment treatment such as a rubbing treatment, is provided thereunder. The counter electrode 21 is composed of, for example, a transparent conductive thin-film such as ITO film. The alignment layer 22 is composed of, for example, an organic thin-film such as a polyimide thin-film.

As shown in FIG. 3, the TFT array substrate 10 is provided with a pixel-switching TFT 30, which controls by switching each pixel electrode 9a, at a position adjoining each pixel electrode 9a.

As also shown in FIG. 3, the opposing substrate 20 is provided with a second light-shielding film 23 in regions other than the opening region of each pixel section. Thus, light incident on the opposing substrate 20 does not enter a channel region 1a' of the semiconductor layer 1a or lightly doped drain (LDD) regions 1b or 1c of the pixel-switching TFT 30. The second light-shielding film 23 also contributes to an improvement in contrast and prevents color mixing of coloring agents.

A liquid crystal is interposed in a gap surrounded by a sealant (not shown in the drawing) between the TFT array substrate 10 and the opposing substrate 20, which are arranged so that the pixel electrode 9a faces the counter electrode 21, to form a liquid crystal layer 50. The liquid crystal layer 50 has a predetermined alignment state by means of the alignment layers 16 and 22 in a state in which no electric field is applied from the pixel electrode 9a. The liquid crystal layer 50 is composed of, for example, one type of or a mixture of several types of nematic liquid crystals. The sealant is an adhesive composed of, for example, a photo-curable resin or a thermosetting resin for bonding the two substrates 10 and 20 in the peripheries thereof, and contains spacers, such as glass fiber or glass beads, to maintain the gap between these substrates at a given distance.

As shown in FIG. 3, the first light-shielding film 11a is provided at a position corresponding to each pixel-switching TFT 30 on the TFT array substrate 10 at a position opposing to the pixel-switching TFT 30. The first light-shielding film 11a is preferably composed of an elemental metal, an alloy, or a metal silicide, which may consist of at least one opaque high-melting-point metal selected from Ti, Cr, W, Ta, Mo and Pd. When such a material is used, the first light-shielding film 11a will not be broken or melted by a high-temperature treatment in a step for forming the pixel-switching TFT 30 subsequent to a step for forming the first light-shielding film 11a on the TFT array substrate 10. The first light-shielding film 11a can prevent returning light entering from the side of the TFT array substrate 10 into the channel region 1a' and the LDD regions 1b and 1c of the pixel-switching TFT 30, and thus avoid deterioration of characteristics of the pixel-switching TFT 30 as a transistor element due to generation of a photocurrent.

In addition, a first interlayer insulating layer 12 is provided between the first light-shielding film 11a and the plurality of pixel-switching TFTs 30. The first interlayer insulating layer 12 is provided in order to electrically insulate the semiconductor layers 1a constituting the pixel-switching TFTs 30 from the first light-shielding film 11a. Also, the first interlayer insulating layer 12, which is formed on the entire surface of the TFT array substrate 10, functions as an underlying film for the pixel-switching TFTs 30. That is, the interlayer prevents roughening on the surface of the TFT array substrate 10 during polishing and deterioration of characteristics of the pixel-switching TFTs 30 by contamination after cleaning. The first interlayer insulating layer 12 is composed of, for example a highly insulating glass, e.g., non-doped silicate glass (NSG), phosphosilicate glass (PSG), borosilicate glass (BSG), or borophosphosilicate glass (BPSG), a silicon oxide film, or a silicon nitride film. The first interlayer insulating film 12 can prevent the pixel switching TFTs 30 from being polluted by the first light-shielding film 11a.

In this embodiment, a gate insulating film 2 extends from a position opposing the scanning line 3a and is used as a dielectric film, and the semiconductor layer 1a also extends to form a first storage capacitor electrode 1f. Moreover, a part of the opposing capacitor line 3b is used as a second storage capacitor electrode to form a storage capacitor 70. In more detail, a high-concentration drain region 1e of the semiconductor layer 1a is opposingly disposed at the portion of the capacitor line 3b extending along the data line 6a and the scanning line 3a with the insulating film 2 provided therebetween to form the first storage capacitor electrode (semiconductor layer) 1f. In particular, the insulating film 2, as the dielectric member in the storage capacitor 70, is the same as the gate insulating film 2 of the TFT 30 formed on the single-crystal silicon layer by high-temperature oxidation, and thus, is a thin insulating film having a high withstanding voltage. As a result, the storage capacitor 70 can have a large capacitance regardless of its relatively low area.

In the storage capacitor 70, as shown in FIGS. 2 and 3, the first light-shielding film 11a lies as a third storage capacitor electrode, opposed to the first storage capacitor electrode 1f with the first interlayer insulating layer 12 therebetween, at a side away from the capacitor line 3b as the second storage capacitor electrode (see the storage capacitor 70 at the right side in FIG. 3) so that a further storage capacitor is provided. That is, this embodiment includes a double storage capacitor structure having two storage capacitors on two sides of the first storage capacitor electrode 1f and enhancing the storage capacitance. Accordingly, the liquid crystal device has further improved functions which avoid flicker and image persistence.

As a result, the storage capacitance in the pixel electrode 9a can be increased by effectively using the spaces outside the opening region, such as a region below the data line 6a and a region causing disclination of the liquid crystal (that is, the region in which the capacitor line 3b is formed) along the scanning line 3a.

The first light-shielding film 11a (including the capacitor line 3b electrically-connected thereto) is electrically connected to a potentiostatic source so that the first light-shielding film 11a and the capacitor line 3b are potentiostatic. Thus, a change in potential of the first light-shielding film 11a does not adversely affect the pixel switching TFT 30 arranged opposite to the first light-shielding film 11a. Moreover, the capacitor line 3b can function as a second storage capacitor electrode of the storage capacitor 70. In this case, the potentiostatic source may be a potentiostatic source, such as a negative or positive electrical power source, which is supplied to peripheral circuits (for example, scanning line driving circuit, data line driving circuit and the like) for driving the liquid crystal device, a grounded electrical power source, or a potentiostatic source supplied to the counter electrode 21. By using the electrical power source supplied to the peripheral circuits, the first light-shielding film 11a and the capacitor line 3b can be maintained at a constant potential without providing an exclusive potential line or an external input terminal.

As shown in FIGS. 2 and 3, the first light-shielding film 11a is electrically connected to the previous or subsequent capacitor line 3b via the contact hole 13. Thus, the difference in step between the region in which the capacitor line 3b and the first light-shielding film 11a are formed so as to overlap with the data line 6a and the other region is smaller than that of a case in which each first light-shielding film 11a is electrically connected to the capacitor line at the same step. Such a small difference in step along the opening of the pixel section can decrease disclination (unsuccessful alignment) of the liquid crystal which is caused in response to the difference in step, and thus the opening region of the pixel section can be expanded.

The first light-shielding film 11a has the contact hole 13 at a projecting portion projecting from the straight main line section, as described above. It is clear that cracks barely form as long as the position of the contact hole 13 is close to the edge because stress is released from the edge. Accordingly, when the contact hole 13 is formed near the edge of the projecting section (preferably close to the edge with a minimum margin), stress applied to the first light-shielding film 11a in the production process can be reduced, resulting in effective prevention of cracks and an improvement in yield.

As shown in FIGS. 2, 4 and 5, the channel region 1a' of the semiconductor layer 1a has an extending portion 201 extending in the X direction (herein, the Y direction is parallel to the source region, the channel region and the drain region of the semiconductor layer 1a, whereas the X direction is perpendicular to the Y direction on the substrate 10). As a result, the extending portion 201 extends so as to face the scanning line 3a. The terminal of the extending portion 201 is connected to a connecting line 203 via a contact hole 202 formed in a second interlayer insulating layer 4. The connecting line 203 is connected to the extending portion 201 via the contact hole 202 at one end, extends right above the capacitor line 3b in the Y direction, and is connected to the capacitor line 3b via a contact hole 204. The channel region 1a' of the semiconductor layer 1a is fixed to a potential of the capacitor line 3b connected to the above potentiostatic source, and this configuration does not cause deterioration of withstand voltage of the source and drain in the transistor element due to substrate stray effects inherent in the SOI structure and can stabilize electrical characteristics of the device.

The scanning line 3a and the capacitor line 3b are arranged so as to be adjacent to each other on a layer between the first interlayer insulating layer 12 and the second interlayer insulating layer 4, and the extending portion 201 extends so as to face the scanning line 3a. Thus, the scanning line 3a and the contact hole 202 interfere with each other in the arrangement. Thus, in this embodiment, the scanning line 3a has a detour section 3a' so as to avoid the contact hole 202.

The capacitor line 3b and the scanning line 3a are composed of the same polysilicon film. The dielectric film of the storage capacitor 70 and the gate insulating film 2 of the TFT 30 are composed of the same high-temperature oxide film. The channel forming region 1a', a source region 1d, a drain region 1e, and the extending portion 201 of the TFT 30 are composed of the same semiconductor layer 1a. The data line 6a and the connecting line 203 are composed of the same metal film. Thus, the laminate structure formed on the TFT array substrate 10 can be simplified. Moreover, in the method for making the liquid crystal device described below, the capacitor line 3b and the scanning line 3a can be simultaneously formed in the same thin-film forming step, and the dielectric film, the gate insulating film 2, and the like of the storage capacitor 70 can be simultaneously formed.

In addition, the first light-shielding film 11a extends along the scanning line 3a and is divided into a plurality of stripes along the data line 6a. In the laminate structure of the liquid crystal device including the polysilicon film forming the first light-shielding film 11a, the scanning line 3a, the capacitor line 3b, the metal film forming the data line 6a, and the interlayer insulating layer, stress generated by heating and cooling in the production process due to a difference in physical properties between these films can be significantly suppressed, compared to, for example, a case in which a lattice light-shielding film is integrally formed on the peripheries of the opening region of each pixel. As a result, in the first light-shielding film 11a, etc., generation of cracks is prevented and the yield is improved.

In FIG. 2, the linear main section of the first light-shielding film 11a is formed to substantially overlap the linear main section of the capacitor line 3b. When the first light-shielding film 11a is provided at a position which covers the channel region of the TFT 30 and overlaps the capacitor line 3b at any position so that the contact hole 13 can be formed, the film can achieve light-shielding effects of the TFT and low resistance of the capacitor line. Thus, for example, the first light-shielding film 11a can also be provided in an oblong gap region between the scanning line 3a and the capacitor line 3b along the scanning line 3a and at a position which is slightly shifted from the scanning line 3a.

Although the capacitor line 3b and the first light-shielding film 11a are securely electrically connected with high reliability via the contact hole 13 provided in the first interlayer insulating layer 12, such a contact hole 13 may be formed with respect to each pixel or each pixel group including a plurality of pixels.

When the contact hole 13 is formed with respect to each pixel, low resistance of the capacitor line 3b by the first light-shielding film 11a can be promoted and the extent of a redundant structure therebetween can be enhanced. When the contact hole 13 is provided with respect to each pixel group including a plurality of pixels (for example, two pixels or three pixels), advantages of low resistance and the redundant structure of the first light-shielding film 11a and the capacitor line 3b and disadvantages of complicated production steps or malfunction of the liquid crystal device due to providing many contact holes 13 can be appropriately balanced, in consideration of the sheet resistance of the capacitor line 3b and the first light-shielding film 11a, the driving frequency, and required specifications, and this is significantly advantageous in practice.

The contact hole 13 provided with respect to each pixel or pixel group is provided below the data line 6a when viewed from the counter substrate 20. Thus, the contact hole 13 lies outside the opening region of the pixel section and is provided at the section of the first interlayer insulating layer 12 in which the TFT 30 or the first storage capacitor electrode 1f is not formed. Thus, the pixel region can be effectively used while hindrances in the TFT 30 and other lines due to the formation of the contact hole 13 can be avoided.

Referring to FIG. 3 again, the pixel-switching TFT 30 has a lightly-doped drain (LDD) structure and is provided with the scanning line 3a, the channel region 1a' of the semiconductor layer Ia for forming a channel by an electric field from the scanning line 3a, the gate insulating film 2 for insulating between the scanning line 3a and the semiconductor layer 1a, the data line 6a, the low-concentration source region (source-side LDD region) 1b and the low-concentration drain region (drain-side LDD region) 1c of the semiconductor layer 1a, and a high-concentration source region 1d and the high-concentration drain region 1e of the semiconductor layer 1a. The high-concentration drain region 1e is connected to a corresponding one of the plurality of pixel electrodes 9a. The source regions 1b and 1d and the drain regions 1c and 1e are formed by doping an n-type or a p-type dopant in a given amount to the semiconductor layer 1a, depending on the formation of an n-type or p-type channel. The TFT with an n-type channel is advantageous in high operational speed, and is often used as the pixel-switching TFT 30, which is a switching device of the pixel. The data line 6a is composed of a light-shielding thin-film, such as a metal film, for example, Al, or an alloy film, for example, a metal silicide. The second interlayer insulating layer 4 provided with a contact hole 5 connected to the high-concentration source region 1d and a contact hole 8 connected to the high-concentration drain region 1e is formed above the scanning line 3a, the gate insulating film 2 and the first interlayer insulating layer 12. The data line 6a is electrically connected to the high-concentration source region 1d via the contact hole 5. A third interlayer insulating layer 7 provided with the contact hole 8 to the high-concentration drain region 1e is formed above the data line 6a and the second interlayer insulating layer 4. The pixel electrode 9a is electrically connected to the high-concentration drain region 1e via the contact hole 8. The above-described pixel electrode 9a is formed on the upper surface of the third interlayer insulating layer 7 having such a configuration. The pixel electrode 9a and the high-concentration drain region 1e may be electrically connected to each other via the same Al film as that for the data line 6a or the same polysilicon film as that for the scanning line 3b.

The pixel-switching TFT 30 preferably has an LDD structure, as described above, but may have an offset structure in which impurity ions are not implanted into the low-concentration source region 1b and the low-concentration drain region 1c, or may have a self-alignment type TFT in which impurity ions in a high concentration are implanted through the gate electrode 3a as a mask to form high-concentration source and drain regions by self-alignment.

A single gate structure is provided in which one gate electrode (scanning line 3a) of the pixel switching TFT 30 is arranged between the source and drain regions 1b and 1e. Alternatively, two or more gate electrodes may be provided therebetween. In such a case, the same signal is applied to each gate electrode. When the TFT has a double gate or triple gate configuration, a leakage current is avoided at the junction between the channel and the source-drain regions, and thus the OFF current can be reduced. When at least one gate electrode has a LDD or offset structure, the OFF current can be further reduced and the switching element is stabilized.

In general, when light is incident on the single crystal silicon layer, such as the channel region 1a', the low-concentration source region 1b and the low-concentration drain region 1c of the semiconductor layer 1a, a photocurrent is generated by photoelectric conversion effects of silicon and transistor characteristics of the pixel-switching TFT 30 significantly deteriorate. In this embodiment, the data line 6a etc., is formed of a metal light-shielding thin-film of Al so as to cover the scanning line 3a from the upper side, in order to effectively prevent light entering at least into the channel region 1a' and the LDD regions 1b and 1c of the semiconductor layer 1a. Moreover, the first light-shielding film 11a is provided below the pixel-switching TFT 30, as described above, in order to effectively prevent returning light from entering at least into the channel region 1a' and the LDD regions 1b and 1c of the semiconductor layer 1a.

In this embodiment, the capacitor line 3b provided in the previous or subsequent pixel is connected to the first light-shielding film 11a. Thus, a capacitor line 3b is necessary to supply a constant potential to the first light-shielding film 11a with respect to the uppermost or lowermost pixel. Accordingly, it is preferable that an additional capacitor line 3b be provided according to the number of the vertical pixels. FIG. 22 shows a equivalent circuit diagram of a liquid crystal device which may consist of a TFT array substrate and an opposing substrate with liquid crystal therebetween in the embodiment of FIG. 5. As shown in FIG. 22, data lines 6a (S1, S2 . . . ) and scanning lines 3a (G1, G2, G3 . . . ) are wired on a matrix plane, and a pixel-switching TFTs 30 are wired in the vicinity of the intersections of the plane, respectively. The source of the transistor is connected to the data line 6a, the gate electrode is connected to the scanning line 3a, the drain is connected to the pixel electrode. The pixel electrode is opposed to an opposing electrode 21 disposed in the opposing substrate with liquid crystal therebetween for polarity inversion drive. Incidentally, the source and the drain can be switched to each other. Common electrode VLC as a reference potential for polarity inversion drive is applied to the opposing electrode 21. The pixel electrode 9a and the opposing electrode 21 constitute a liquid crystal capacitor CLC in which a liquid crystal layer is used as a dielectric. Further, storage capacitor Cs is disposed between the storage capacitor electrode 1f and the capacitor line 3b. That is, one pixel consists of the transistor, the liquid crystal capacitor and the storage capacitor connected to the transistor.

The channel region 1a of the transistor 30 is electrically connected to the capacitor line 3b for driving the transistor 30. Each of the channel regions 1f of the transistor is electrically connected to the capacitor lines 3b which is one electrode of the capacitor connected to the transistor, and restrain substrate stray effect by delivering excess carrier stored from the channel region 1a to the capacitor lines 3b. Incidentally, the capacitor line 3b is applied with the common electrode potential VLC.

(Method for Making Electro-optical Device)

A production process of the liquid crystal device having the above configuration will now be described with reference to FIGS. 6 to 11.

FIGS. 6 to 11 are process charts showing layers at the TFT array substrate in steps, corresponding to the same FIG. 2 III–III' cross-section, as that in FIG. 3.

As shown in Step (1) in FIG. 6, the TFT array substrate 10, such as a quartz substrate or a hard glass substrate, is provided. It is preferable that the substrate be preliminarily treated by annealing at a high temperature of approximately 900 to 1,300° C. in an inert gas atmosphere such as $N_2$ (nitrogen) in order to reduce the formation of strain in the TFT array substrate 10 during the subsequent high-temperature process. That is, the TFT array substrate 10 is preliminarily annealed at least at the maximum temperature in the production process.

A metal film such as Ti, Cr, W, Ta, Mo or Pd, or an alloy film such as a metal silicide, is formed on the entire surface of the resulting TFT array substrate 10 by sputtering to form a light-shielding film 11 having a thickness of approximately 200 to 400 nm, and preferably approximately 200 nm.

As shown in Step (2), a resist mask corresponding to the pattern (see FIG. 2) of the first light-shielding film 11a is formed on the resulting light-shielding film 11 by photolithography and the light-shielding film 11 is etched through the resist mask to form the first light-shielding film 11a.

As shown in Step (3), the first interlayer insulating layer 12 composed of a silicate glass film such as NSG, PSG, BSG or BPSG, or a silicon nitride or oxide film, is formed on the first light-shielding film 11a by, for example, a normal-pressure or reduced-pressure CVD process using a tetraethyl orthosilicate (TEOS) gas, a tetraethyl borate (TEB) gas, or a trimethyl phosphate (TMOP) gas. The thickness of the first interlayer insulating layer 12 is, for example, approximately 600 nm to 1,000 nm, and preferably approximately 800 nm.

As shown in Step (4), the entire surface of the first interlayer insulating layer 12 is polished to planarize the surface. An exemplary planarization method is a chemomechanical polishing (CMP) process.

As shown in Step (5), the substrate 10 is bonded to a single-crystal silicon substrate 206a. The single-crystal silicon substrate 206a used in bonding has a thickness of 600 μm, the surface thereof is previously oxidized by approximately 0.05 to 0.8 μm to form an oxide layer 206b, and hydrogen ions ($H^+$) at a dosage of $10e16/cm^2$ are implanted at an acceleration voltage of, for example, 100 keV. In the bonding step, the two substrates may be directly bonded to each other by, for example, annealing at 300° C. for 2 hours.

As shown in Step (6), annealing is performed to cleave the single-crystal silicon substrate 206a from the substrate 10 while the oxide layer 206b at the bonding surface side of the bonded single-crystal silicon substrate 206a and the single-crystal silicon layer 206 remain. The cleavage phenomenon of the substrate occurs by scission of silicon in a certain layer in the vicinity of the single-crystal silicon substrate by hydrogen ions introduced into the single-crystal silicon substrate. For example, cleavage can be performed by heating the two bonded substrates to 600° C. at a heating rate of 20° C./min. By the annealing, the bonded single-crystal silicon substrate 206a is cleaved from the substrate 10 to form a single-crystal silicon layer 206 of approximately 200 nm±5 nm on the surface of the substrate 10. The single-crystal silicon layer 206 bonded to the substrate 10 can be formed by varying the acceleration voltage of hydrogen ion implantation onto the single-crystal silicon substrate so as to have an appropriate thickness.

As shown in Step (7), the semiconductor layer 1a having a predetermined pattern, as shown in FIG. 2, is formed by a photolithographic process or an etching process. That is, the first storage capacitor electrode 1f extending from the semiconductor layer 1a constituting the pixel-switching TFT 30 is formed in a region in which the capacitor line 3b is formed below the data line 6a and in a region in which the capacitor line 3b is formed along the scanning line 3a. Also, the extending portion 201 extending from the channel region 1a' of the semiconductor layer 1a is simultaneously formed.

As shown in STEP (8), the semiconductor layer 1a constituting the pixel-switching TFT 30 and the first storage capacitor electrode If are thermally oxidized at a temperature of approximately 850 to 1,300° C., and preferably approximately 1,000° C., for approximately 72 minutes to form a thermal silicon oxide film having a relatively small thickness of approximately 60 nm and to form the gate insulating film 2 for the pixel-switching TFT 30 and the gate insulating film 2 for a capacitor. As a result, the total thickness of the semiconductor layer 1*a* and the first storage capacitor electrode 1*f* is approximately 170 nm, and the thickness of the gate insulating film 2 is approximately 60 nm.

As shown in STEP (9) in FIG. 7, a resist film 301 is formed at a position corresponding to the N-channel semiconductor layer 1*a*, and the P-channel semiconductor layer 1*a* is doped with a Group V dopant 302, such as P, at a low concentration (for example, P ions at a dosage of $2e11/cm^2$ and an acceleration voltage of 70 keV).

As shown in STEP (10), a resist film (not shown in the drawing) is formed at a position corresponding to the P-channel semiconductor layer 1*a*, and the N-channel semiconductor layer 1*a* is doped with a Group III dopant 303, such as B, at a low concentration (for example, B ions at a dosage of $1e12/cm^2$ and an acceleration voltage of 35 keV).

As shown in graphs in FIGS. 17 and 18, the type of the dopant, the dosage, and the order of the steps can control the threshold voltage Vth of each channel.

FIG. 17 shows the relationship between the threshold voltage Vth and the dosage in the P channel. Plot ① in FIG. 17 represents the results of simulation when boron is used as the dopant, Plot ② in FIG. 17 represents the results of the simulation when phosphorus is used as the dopant, and plot ③ represents the experimental results. According to these results, it is preferable that phosphorus be implanted at a dosage of $1e12/cm^2$ when a threshold voltage Vth of −1.5 V is required.

FIG. 18 shows the relationship between the threshold voltage Vth and the dosage in the N channel. Plot ① in FIG. 18 represents the results of simulation when boron is used as the dopant, Plot ② in FIG. 18 represents the experimental results when STEP (9) and STEP (10) are performed after STEP (8), and plot ③ represents the experimental results when STEP (8) is performed after STEP (9) and STEP (10). According to these results, it is preferable that boron be implanted at a dosage of $7e11/cm^2$ when a threshold voltage Vth of 1.5 V is required.

As shown in STEP (11), a resist film 305 is formed on the surface of the substrate 10 other than an edge 304 (see FIGS. 12 and 13) of the channel region 1*a'* of each semiconductor layer 1*a* with respect to the P channel and the N channel. The P channel at the edge 304 is doped with a Group V dopant 306, such as P, at a dosage which is approximately 1 to 10 times that in STEP (9), whereas the N channel is doped with a Group III dopant 306, such as B, at a dosage which is approximately 1 to 10 times that in STEP (10). At the edge 304 of the channel region 1*a'* of the semiconductor layer 1*a*, the apparent threshold voltage is low, which causes a leakage current, due to concentration of an electric field. However, the impurity concentration at the edge 304 of the channel region 1*a'* of the semiconductor layer 1*a* is higher than that in the other portions as a result of the above doping steps. Thus, the apparent threshold voltage in this region increases to avoid generation of the leakage current due to concentration of the electric field.

As shown in STEP (12), a resist film 307 (having a width which is greater than that of the scanning line 3*a*) is formed at a position corresponding to the scanning line 3*a* (gate electrode) on the surface of the substrate 10 in order to decrease the resistance of the first storage capacitor electrode 1*f* formed by extension of the semiconductor layer 1*a*. A Group V dopant 308, such as P, is implanted at a low concentration (for example, P ions at a dosage of $3e14/cm^2$ and an acceleration voltage of 70 keV) through the resist film mask.

As shown in STEP (13) in FIG. 8, the contact hole 13 is formed in the first interlayer insulating layer 12 by dry etching, such as reactive etching or reactive ion beam etching, or wet etching so as to reach the first light-shielding film 11*a*. The formation of the contact hole 13 by anisotropic etching such as reactive etching or reactive ion beam etching is advantageous since the shape of the opening can be substantially equal to the shape of the mask. A combination of dry etching and wet etching can form a tapered contact hole 13 and thus is advantageous in preventing disconnection when lead lines are connected.

As shown in STEP (14), a polysilicon layer 3 with a thickness of 350 to 550 nm is deposited by a reduced-pressure CVD process, and then phosphorus (P) is thermally diffused to produce conductivity in the polysilicon layer 3. Alternatively, a doped silicon film in which P ions are simultaneously introduced when the polysilicon layer 3 is formed may be used. The conductivity of the polysilicon layer 3 can be thereby enhanced. Since the thickness of the scanning line in the gate electrode region is greater than 350 nm, the wiring resistance can be reduced to sufficiently suppress a decrease in the writing rate of signals into pixels due to wiring delay. Since the thickness of the scanning line in the gate electrode region is less than 550 nm, bumps on the device substrate can be suppressed as much as possible. Thus, disclination when the liquid crystal is aligned can be suppressed and the display quality can be maintained at a satisfactory level. A conductive metal layer may be deposited in order to enhance the conductivity in addition to the polysilicon layer 3.

As shown in STEP (15), the scanning line 3*a* and the capacitor line 3*b* having predetermined patterns, as shown in FIG. 2, are formed by a photolithographic process and an etching process using a resist mask. The front surface of the substrate 10 is covered with a resist film to remove the polysilicon remaining on the rear surface of the substrate 10.

As shown in STEP (16), in order to form the P-channel LDD region in the semiconductor layer 1*a*, a position corresponding to the N-channel semiconductor layer 1*a* is covered with a resist film 309 (the drawing shows the N-channel semiconductor layer 1*a*), and a Group III dopant 310, such as B, at a low concentration (for example, $BF_2$ ions at a dosage of $3e13/cm^2$ and an acceleration voltage of 90 keV) is implanted through the scanning line 3*a* (gate electrode) as a diffusion mask to form the low-concentration source region 1*b* and the low-concentration drain region 1*c* of the P channel.

As shown in STEP (17), in order to form the high-concentration source region 1*d* and the high-concentration drain region 1*e* of the P channel into the semiconductor layer 1*a*, a Group III dopant 311, such as B, at a high concentration (for example, $BF_2$ ions at a dosage of $2e15/cm^2$ and an acceleration voltage of 90 keV) is implanted in a state in which a position corresponding to the N-channel semiconductor layer 1*a* is covered with the resist film 309 and a resist film (not show in the drawing) is formed on the scanning line 3*a* corresponding to the P channel using a mask having a width which is greater than that of the scanning line 3*a*.

As shown in STEP (18) in FIG. 9, in order to form the N-channel LDD region into the semiconductor layer 1*a*, a position corresponding to the P-channel semiconductor layer 1*a* is covered with a resist film (not shown in the drawing), and a Group V dopant 60, such as P, at a low concentration (for example, P ions at a dosage of 6e12/cm$^2$ and an acceleration voltage of 70 keV) is implanted thorough the scanning line 3a (gate electrode) as a diffusion mask to form the low-concentration source region 1b and the low-concentration drain region 1c.

As shown in STEP (19), in order to form the high-concentration source region 1d and the high-concentration drain region 1e of the N channel into the semiconductor layer 1a, a resist layer 62 is formed on the scanning line 3a corresponding to the N-channel through a mask having a width which is greater than the scanning line 3a, and then a Group V dopant 61, such as P, at a high concentration (for example, P ions at a dosage of 4e15/cm$^2$ and an acceleration voltage of 70 keV) is implanted.

FIG. 19 shows voltage versus current characteristics of the P-channel semiconductor layer 1a formed by doping the LDD region with the dopant 311 at a dosage of 3e13/cm$^2$. FIG. 20 shows voltage versus current characteristics of the N-channel semiconductor layer 1a formed by doping the LDD region with the dopant 61 at a dosage of 1e13/cm$^2$. FIG. 21 shows voltage versus current characteristics of the N-channel semiconductor layer 1a formed by doping the LDD region with the dopant 61 at a dosage of 6e12/cm$^2$.

As shown in STEP (20), the second interlayer insulating layer 4 composed of a silicate glass film, e.g., NSG, PSG, BSG, or BPSG, a silicon nitride film or a silicon oxide film is formed, for example, by a normal-pressure or reduced-pressure CVD process using a TEOS gas so as to cover the capacitor line 3b and the scanning line 3a, in addition to the scanning line 3a in the pixel-switching TFT 30. The thickness of the second insulating film 4 is preferably approximately 600 to 1,500 nm, and more preferably 800 nm.

Next, the high-concentration source region 1d and the high-concentration drain region 1e are activated by annealing at approximately 850° C. for approximately 20 minutes.

As shown in STEP (21), a contact hole 5 and the contact holes 202 and 204 (see FIGS. 4 and 5) for forming the data line 6a are formed by dry etching such as reactive ion etching or reactive ion beam etching, or by wet etching. Contact holes (not shown in the drawing) for connecting the scanning line 3a and the capacitor line 3b to lead lines are also formed in the second interlayer insulating layer 4 by the same step.

As shown in STEP (22) in FIG. 10, a metal film 6 of a low-resistance metal, such as light-shielding Al, or of a metal silicide having a thickness of approximately 100 to 700 nm and, preferably approximately 350 nm, is deposited on the second interlayer insulating layer 4 by a sputtering process or the like. As shown in STEP (23), the data line 6a is formed by a photolithographic process and an etching process. The connecting line 203 of the metal film 6 is also simultaneously formed (see FIGS. 4 and 5).

As shown in STEP (24), the third interlayer insulating layer 7 composed of a silicate glass film, e.g., NSG, PSG, BSG, or BPSG, a silicon nitride film or a silicon oxide film is formed, for example, by a normal-pressure or reduced-pressure CVD process using a TEOS gas so as to cover the data line 6a. The thickness of the third interlayer insulating layer 7 is preferably approximately 600 to 1,500 nm, and more preferably 800 nm.

As shown in STEP (25) in FIG. 11, a contact hole 8 for electrically connecting the pixel electrode 9a to the high-concentration drain region 1e in the pixel-switching TFT 30 is formed by dry etching such as reactive ion etching or reactive ion beam etching, or by wet etching.

As shown in STEP (26), a transparent conductive thin-film 9, such as an ITO film with a thickness of approximately 50 to 200 nm, is deposited on the third interlayer insulating layer 7 by a sputtering process or the like. As shown in STEP (27), the pixel electrode 9a is formed by a photolithographic process or an etching process. When this liquid crystal device is used as a reflective liquid crystal device, the pixel electrode 9a may be formed of an opaque material having high reflectance, such as Al.

A coating solution for a polyimide alignment film is applied onto the pixel electrode 9a and is then subjected to a rubbing treatment in a predetermined direction to form an alignment film 16 (see FIG. 3) having a predetermined pretilt angle.

Regarding the opposing substrate 20 shown in FIGS. 3 and 4, a glass substrate etc., is prepared, and a second light-shielding film, as the second light-shielding film 23 and as a frame edge described later, is formed by sputtering chromium metal, followed by a photolithographic process and an etching process. The second light-shielding film may be formed of a metal material such as Cr, Ni or Al, or a black resin in which carbon or Ti is dispersed into a photoresist.

A transparent conductive thin-film of ITO etc., having a thickness of approximately 50 to 200 nm is formed on the entire surface of the opposing substrate 20 by a sputtering process to form the counter electrode 21. A coating solution of a polyimide alignment film is applied onto the entire surface of the counter electrode 21 and is subjected to a rubbing treatment in a predetermined direction to form an alignment film 22 (see FIG. 3) having a predetermined pretilt angle.

Finally, the TFT array substrate 10 provided with the above-described layers and the opposing substrate 20 are bonded to each other by a sealant 52 so that the alignment films 16 and 22 face each other, and a liquid crystal composed of a mixture of several types of nematic liquid crystal is introduced into the gap between these substrates by vacuum suction to form a liquid crystal layer 50 having a predetermined thickness.

(Overall Configuration of Liquid Crystal Device)

The overall configurations of the above-described embodiments of the liquid crystal device will be described with reference to FIGS. 14 and 15. FIG. 14 is a plan view of the TFT array substrate 10 with constituents formed thereon when viewed from the opposing substrate side 20, and FIG. 15 is a cross-sectional view including the opposing substrate 20 taken from line H–H' in FIG. 14.

In FIG. 14, the sealant 52 is provided along the edges on the TFT array substrate 10, and a second light-shielding film 53 as a frame edge, composed of the same material or a different material from the second light-shielding film 23, is provided parallel to the inner side thereof. In an exterior region of the sealant 52, a data line driving circuit 101 and a mounted terminal 102 are provided along one side of the TFT array substrate 10, and scanning line driving circuits 104 are provided along two adjacent sides. If delay of scanning signals supplied to the scanning line 3a is negligible, the scanning driving circuit 104 may be provided at one side. The data line-driving circuit 101 may be arranged along both sides of the screen display region. For example, data lines 6a lying in odd rows may supply image signals from the data line-driving circuit arranged along one side of the screen display region, while data lines in even rows may supply image signals form the data line-driving circuit arranged along the opposite side of the screen display region. By alternately driving the data lines 6a, the area of the data line-driving circuit can be expanded and a complicated circuit can be provided. A plurality of lead lines 105 for connecting the scanning line driving circuits 104 provided at both sides of the screen display region is provided at the last side of the TFT array substrate 10. A conductor 106 is provided at least at one corner of the opposing substrate 20 to electrically connect the TFT array substrate 10 to the opposing substrate 20. As shown in FIG. 15, the opposing substrate 20 having substantially the same contour as that of the sealant 52 shown in FIG. 13 is fixed to the TFT array substrate 10 by the sealant 52.

Moreover, an inspection circuit for inspecting the quality and defects of the liquid crystal device in the production line or before delivery may be formed on the TFT array substrate 10 of the liquid crystal device. The data line-driving circuit 101 and scanning line driving circuits 104 may be provided so that these are electrically and mechanically connected to a driving LSI mounted onto a tape-automated bonding (TAB) substrate through an anisotropic conductive film provided in the peripheral section of the TFT array substrate 10, instead of being provided on the TFT array substrate 10. For example, a polarizing film, a retardation film, and a polarizing element may be arranged in a given direction at the side of the opposing substrate 20 on which projection light is incident and at a side of the TFT array substrate 10 from which light is emitted, according to the operating mode, such as a twisted nematic (TN) mode, a super TN (STN) mode, or a dual scan-STN (D-STN) mode, and a normally white mode or a normally black mode.

When the above-described liquid crystal device is applied to, for example, a color liquid crystal projector (projection display device), three liquid crystal devices are used as light valves for RGB. Decomposed color light components as projective light are incident on these panels through dichroic mirrors for RGB color decomposition. Thus, in such a case, the opposing substrate 20 has no color filter as described in the above embodiments. However, RGB color filters may be formed together with the protective films thereof in predetermined regions opposing the pixel electrode 9a not having the second light-shielding film 23. Such a configuration is applicable to color liquid crystal devices such as direct-view type color liquid crystal television sets and reflective color liquid crystal television sets, in addition to the liquid crystal projectors. In addition, a microlens may be formed on the opposing substrate 20 so as to correspond to each pixel. Such a configuration can produce a bright liquid crystal device due to improved collective efficiency of incident light. Moreover, several interference layers having different refractive indices may be deposited on the opposing substrate 20 to form a dichroic filter for generating RGB color components by means of interference of light. The opposing substrate having the dichroic filter can produce a brighter color liquid crystal device.

The liquid crystal devices in the above embodiments are designed so that light is incident on the opposing substrate 20, as in conventional devices. Since the first light-shielding film 11a is provided, the devices may be designed so that light is incident on the TFT array substrate 10 and emerges from the opposing substrate 20. When the liquid crystal device is assembled into a liquid crystal projector, light does not enter the channel region 1a' and the LDD regions 1b and 1c of the semiconductor layer 1a, and high-quality images can be displayed. In conventional technologies, a polarizing element covered with an antireflective (AR) film is provided or an AR Film is bonded in order to prevent reflection at the rear surface of the TFT array substrate 10. In the above embodiments, the first light-shielding film 11a is formed on the surface of the TFT array substrate 10, and at least between the channel region 1a' and the LDD regions 1b and 1c of the semiconductor layer 1a. Thus, the polarizing element covered with the AR film, the AR film, or an AR-treated TFT array substrate 10 is not necessary. Accordingly, the above embodiments contribute to reduction in material costs, and do not cause a decrease in yield due to contamination or damages when the polarizing element is bonded. Since the devices have high light resistance, deterioration of image quality such as optical crosstalk will not occur when a bright light source is used or when optical efficiency is improved by polarization conversion using a polarized light beam splitter.

(Electronic Apparatus)

A configuration of a projector will be described as an exemplary electronic apparatus using the above liquid crystal devices, with reference to FIG. 16. FIG. 16 is a schematic diagram of an optical system of a projector 1100 provided with three liquid crystal devices which are used as RGB liquid crystal devices 962R, 962G, and 962B. The optical system of the projector in this embodiment includes a light source unit 920 and a uniform illumination optical system 923. The projector has a color separating optical system 924 as a separating system which separates red (R), green (G) and blue (B) light beams from light beams W emitted from the uniform illumination optical system 923; three light valves 925R, 925G, and 925B as a modulating system for modulating the R, G, B color light beams; a color combining prism 910 as a color combining element which recombines the modulated light beams; and a projection lens unit 906 as a projection element which enlarges and projects the recombined light beams onto a projection screen 100. A light guide system 927 for conducting the blue light beam B to the corresponding light valve 925B is also provided.

The uniform illumination optical system 923 has two lens plates 921 and 922 and a reflecting mirror 931. in which the two lens plates 921 and 922 are orthogonally arranged so as to sandwich the reflecting mirror 931. Each of the two lens plates 921 and 922 of the uniform illumination optical system 923 has a plurality of rectangular lenses arranged in a matrix. The light beams emitted from the light source unit 920 are divided into a plurality of partial light beams by the rectangular lenses of the first lens plate 921. These partial light beams are superimposed in the vicinity of the three light valves 925R, 925G, and 925B by the rectangular lenses of the second lens plate 922. Thus, by using the uniform illumination optical system 923, the three light valves 925R, 925G and 925B can be illuminated with uniform illumination light even when the light source unit 920 has a non-uniform illuminance in the cross-section of the emitted light beams.

The color separating optical system 924 includes a blue-green reflecting dichroic mirror 941, a green reflecting dichroic mirror 942, and a reflecting mirror 943. The blue-green reflecting dichroic mirror 941 orthogonally reflects the blue light beam B and the green light beam G contained in the light beams W towards the green reflecting dichroic mirror 942. The red light beam R passes through the mirror 941, is orthogonally reflected by the backward reflecting mirror 943, and is emitted from an emitting section 944 for the red light beam R towards the prism unit 910.

Only the green light beam G of the blue and green light beams B and G, which are reflected by the blue-green reflecting dichroic mirror 941, is orthogonally reflected by the green reflecting dichroic mirror 942 and is emitted from an emitting section 945 for the blue light beam B towards the prism unit 910. The blue light beam B passing through the green reflecting dichroic mirror 942 is emitted from an emitting section 946 for the blue light beam B towards the light guide system 927. In this embodiment, the distances to the emitting sections 944, 945 and 946 for color light beams in the color separating optical system 924 are set to be substantially equal to each other.

Condenser lenses 951 and 952 are disposed at the emitting sides of the emitting sections 944 and 945 for the red and green light beams R and G, respectively, in the color separating optical system 924. Thus, the red and green light beams R and G emitted from the corresponding emitting sections are incident on these condenser lenses 951 and 952, respectively, to be collimated.

The collimated red and green light beams R and G enter the light valves 925R and 925G and are modulated into their respective color image information. That is, these liquid crystal devices are switch-controlled by a driving means not shown in the drawing in response to the image information to modulate their respective color light beams.

On the other hand, the blue light beam B is introduced into the light valve 925B via the light guide system 927 and is modulated in response to the image information. In this embodiment, the light valves 925R, 925G, and 925B include incident-side polarizing elements 960R, 960G, and 960B, respectively, emitting-side polarizing elements 961R, 961G and, 961B, respectively, and liquid crystal devices 962R, 962G, and 962B, respectively, disposed therebetween.

The light guide system 927 includes a condenser lens 954 provided at the emitting side of the emitting section 946 for the blue light beam B, an incident-side reflecting mirror 971, an emitting-side reflecting mirror 972, an intermediate lens 973 provided between these reflecting mirrors, and a condenser lens 953 provided before the light valve 925B. The blue light beam B emitted from the condenser lens 946 is introduced into the liquid crystal device 962B via the light guide system 927 and is modulated. Among optical path lengths of these color light beams, that is, the distances from the emitting section of the light beams W to the liquid crystal devices 962R, 962G and 962B, that of the blue light beam B is the largest. Thus, the blue light beam has the largest optical loss. The intervention of the light guide system 927, however, can suppress the optical loss.

The color light beams R, G, and B modulated in the light valves 925R, 925G, and 925B are incident on the color-combining prism 910 and are recombined therein. The light combined by the color combining prism 910 is enlarged and projected onto the surface of the projection screen 100 placed at a given position via the projection lens unit 906.

Since the light-shielding film is provided below the TFTs in the liquid crystal devices 962R, 962G, and 962G in this embodiment, the channels of the TFTs switching for pixel electrodes can be sufficiently shielded from light when reflected light from the projection optical system in the liquid crystal projector based on the projection light from the liquid crystal devices 962R, 962G and 962B, reflected light from the TFT array substrate when the projection light passes through, and a part of the projection light leaking from the projection optical system after being emitted from the other liquid crystal devices enter the side of the TFT array substrate as returning light.

When a prism unit suitable for miniaturization is used in the projection optical system, it is unnecessary to provide an antireflective film or an antireflective treatment of the polarizing element between these liquid crystal devices 962R, 962G, and 962B. Thus, the configuration is compact, simple and advantageous.

Since this embodiment can suppress the effects of the returning light on the channel region of the TFT, the polarizing elements 961R, 961G, and 961B bonded to the liquid crystal devices do not require treatment for shielding returning light. Thus, as shown in FIG. 16, the polarizing elements can be separated from the liquid crystal devices. That is, the polarizing elements 961R, 961G, and 961B may be bonded to the prism unit 910, while the polarizing elements 960R, 960G, and 960B may be bonded to the condenser lenses 953, 945, and 944, respectively. By bonding the polarizing elements to the prism unit or the condenser lens, the prism unit or the condenser lens can absorb the heat of the polarizing elements to prevent a temperature rise in the liquid crystal device.

Although not shown in the drawing, when the liquid crystal device and the polarizing elements are separately disposed, an air layer is provided between the liquid crystal device and the polarizing elements. By supplying cooling air to the air layer between the liquid crystal device and the polarizing elements using a cooling device, the temperature rise of the liquid crystal device can be further avoided. Thus, malfunction due to temperature rise of the liquid crystal device will not occur.

Although the liquid crystal device is described in this embodiment, this embodiment is also applicable to electro-optical devices such as electroluminescence devices and plasma displays without restriction.

What is claimed is:

1. An electro-optical device comprising:
   a substrate;
   a plurality of scanning lines of the substrate,
   a plurality of data lines crossing the plurality of scanning lines on the substrate;
   transistors connected to each of the scanning lines and to each of the data lines;
   pixel electrodes connected to the transistors; and
   storage capacitors, an extending portion of a semiconductor layer functioning as a channel region of a transistor being connected to a capacitor line functioning as an electrode of a storage capacitor.

2. The electro-optical device according to claim 1, further comprising a first contact hole formed above the extending portion and a second contact hole formed on the capacitor line, the extending portion and the capacitor line being connected to each other by a connecting line via the first contact hole and the second contact hole, and the scanning line and the capacitor line lying in a same layer and having detour sections formed so as to detour around the first contact hole.

3. The electro-optical device according to claim 2, the connecting line and a data line being formed on a same layer.

4. The electro-optical device according to of claim 1, the semiconductor layer having a thickness in a range of 100 to 180 nm.

5. The electro-optical device according to claim 1, further comprising a gate insulating film having a thickness of 55 nm±10 nm inserted between the channel region of the semiconductor layer and a gate electrode region of a scanning line.

6. The electro-optical device according to claim 1, an impurity concentration at an edge of the channel region of the semiconductor layer being higher than an impurity concentration of other parts of the channel region.

7. The electro-optical device according to claim 1, a scanning line having a thickness in a range of 350 nm to 550 nm.

8. The electro-optical device according to claim 1, a scanning line comprising a polysilicon layer or at least two layers of a polysilicon and a conductive metal layer.

9. The electro-optical device according to claim 1, further comprising an interlayer insulating layer having a thickness of 800 nm±200 nm inserted between the data lines and at least the scanning lines.

10. The electro-optical device according to claim 1, the data lines having a thickness in a range of 350 nm to 700 nm.

11. The electro-optical device according to claim 1, further comprising an interlayer insulating layer having a thickness of 800 nm±200 nm inserted between the data lines and at least the pixel electrodes.

12. The electro-optical device according to claim 1, further comprising a light-shielding layer provided between the substrate and the semiconductor layer.

13. The electro-optical device according to claim 12, the light-shielding layer having a thickness in a range of 200 nm to 400 nm.

14. The electro-optical device according to claim 12, the light-shielding layer being electrically connected to the capacitor line.

15. The electro-optical device according to claim 1, the substrate provided with the semiconductor layer being a first substrate, the electro-optical device further comprising:
   a second substrate opposing a surface of the first substrate; and
   a liquid crystal disposed between the first substrate and the second substrate and driven by transistor elements formed in the semiconductor layer.

16. An electronic apparatus comprising:
   a light source;
   an electro-optical device according to claim 15 that modulates light emitted from the light source in response to image information; and
   a projection device that projects the light modulated by the electro-optical device.

* * * * *

UNITED STATES PATENT AND TRADEMARK OFFICE
CERTIFICATE OF CORRECTION

PATENT NO.    : 6,320,204 B1
DATED         : November 20, 2001
INVENTOR(S)   : Yukiya Hirabayashi et al.

It is certified that error appears in the above-identified patent and that said Letters Patent is hereby corrected as shown below:

Column 24,
Line 27, change "of the substrate" to -- on the substrate --.

Signed and Sealed this

Eighteenth Day of February, 2003

JAMES E. ROGAN
*Director of the United States Patent and Trademark Office*